(12) United States Patent
Nakakubo

(10) Patent No.: US 8,294,448 B2
(45) Date of Patent: Oct. 23, 2012

(54) SEMICONDUCTOR MEMORY POWER CONTROL SYSTEM WITH VOLTAGE GENERATOR TO SUPPLY VOLTAGE TO AN INTERNAL CIRCUIT BY BOOSTING AN EXTERNAL VOLTAGE

(75) Inventor: Atsushi Nakakubo, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 372 days.

(21) Appl. No.: 12/624,799

(22) Filed: Nov. 24, 2009

(65) Prior Publication Data
US 2010/0066339 A1 Mar. 18, 2010

(30) Foreign Application Priority Data
Dec. 5, 2008 (JP) ................. 2008-311007

(51) Int. Cl.
G05F 5/00 (2006.01)
G05F 1/24 (2006.01)
(52) U.S. Cl. .................. 323/299; 323/344

(58) Field of Classification Search ............... 323/901, 323/299, 344
See application file for complete search history.

(56) References Cited

U.S. PATENT DOCUMENTS

| 4,961,007 A * | 10/1990 | Kumanoya et al. ......... 327/537 |
| 6,060,873 A * | 5/2000 | Ternullo et al. ............... 323/316 |
| 6,205,079 B1 | 3/2001 | Namekawa |
| 2005/0116696 A1* | 6/2005 | Suematsu ..................... 323/280 |

FOREIGN PATENT DOCUMENTS
JP 11-297069 A 10/1999
JP 2000-339958 A 12/2000
* cited by examiner Primary Examiner — Adolf Berhane
Assistant Examiner — Emily Pham
(74) Attorney, Agent, or Firm — Arent Fox LLP

(57) ABSTRACT

A semiconductor device is provides which includes: a first boost circuit that generates a first boost voltage by boosting an external voltage and supplies the first boost voltage to an internal circuit; and a first circuit that supplies the external voltage to an output of the first boost circuit when power is turned on and supplies the first boost voltage to the output of the first boost circuit when the external voltage reaches a given voltage.

18 Claims, 23 Drawing Sheets

SEMICONDUCTOR MEMORY POWER CONTROL SYSTEM WITH VOLTAGE GENERATOR TO SUPPLY VOLTAGE TO AN INTERNAL CIRCUIT BY BOOSTING AN EXTERNAL VOLTAGE

CROSS-REFERENCE TO RELATED APPLICATIONS

This application claims the benefit of priority from Japanese Patent Application No. 2008-311007 filed on Dec. 5, 2008, the entire contents of which are incorporated herein by reference.

BACKGROUND

1. Field

The embodiments discussed herein relate to a voltage generation circuit which generates an internal voltage based on an external voltage.

2. Description of Related Art

A voltage generation circuit which generates an internal voltage based on an external voltage is disclosed in Japanese Laid-open Patent Publication No. H11-297069, Japanese Laid-open Patent Publication No. 2000-339958, or the like.

SUMMARY

According to one aspect of the embodiments, a semiconductor device is provided which includes a first boost circuit that generates a first boost voltage by boosting an external voltage and supplies the first boost voltage to an internal circuit and a first circuit that supplies the external voltage to an output of the first boost circuit when power is turned on and supplies the first boost voltage to the output of the first boost circuit when the external voltage reaches a given voltage.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 9 illustrates an exemplary operation of a semiconductor memory MEM when power is turned on.

DESCRIPTION OF EMBODIMENTS

In the figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
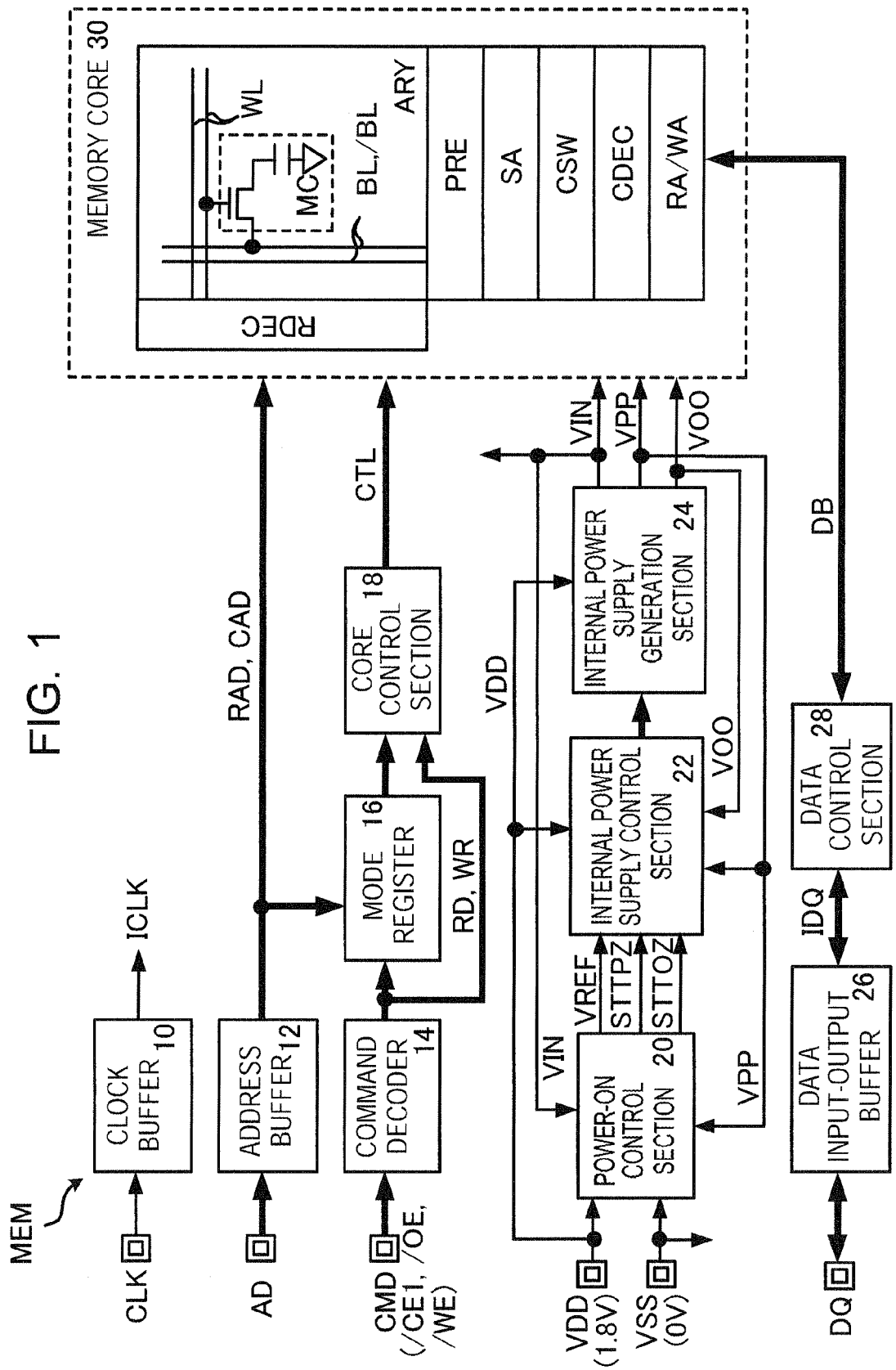
FIG. 1 illustrates a first embodiment.

FIG. 1 illustrates a first embodiment. For example, a semiconductor device according to the first embodiment may be a semiconductor memory MEM such as a pseudo SRAM. The semiconductor memory MEM may operate in synchronism with a clock signal CLK, or the semiconductor memory MEM may operate in asynchronously with the clock signal CLK. The semiconductor memory MEM may include a memory macro (IP) mounted in a system LSI or the like, and may include a semiconductor storage device enclosed in a package.

The semiconductor memory MEM is formed, for example, on a silicon substrate by using a CMOS process. The semiconductor memory MEM includes a clock buffer 10, an address buffer 12, a command decoder 14, a mode register 16, a core control section 18, a power-on control section 20, an internal power supply control section 22, an internal power supply generation section 24, a data input-output buffer 26, a data control section 28, and a memory core 30.

The clock buffer 10 receives the clock signal CLK through a clock terminal and outputs an internal clock signal ICLK. The internal clock signal ICLK is supplied to a circuit which operates in synchronism with a clock. The address buffer 12 receives an address signal AD through an address terminal and outputs the received address signal as a row address signal RAD and a column address signal CAD.

The command decoder 14 receives a command signal CMD through a command terminal, decodes the received signal, and outputs an internal command signal for operating the memory core 30. Examples of the command signals CMD include a chip enable signal /CE1, an output enable signal /OE, and a write enable signal /WE. Examples of the internal command signal include a read signal RD, a write signal WR, and a mode register setting signal.

The mode register 16 is set in accordance with the address signal AD supplied with a mode register setting command. The operational specifications of the semiconductor memory MEM, such as burst length and read latency, are changed by the mode register 16. The core control section 18 outputs a control signal CTL for controlling the operation of the memory core 30 in accordance with the read signal RD, the write signal WR, and a setting signal from the mode register 16.

The power-on control section 20 receives an external power supply voltage VDD and a ground voltage VSS through a power supply terminal, and receives an internal power supply voltage VIN and a boost voltage VPP from the internal power supply generation section 24. The power-on control section 20 generates a reference voltage VREF lower than the power supply voltage VDD. The power-on control section 20 generates activation signals STTPZ and STTOZ, each of which is set at high level for a given period during a power-on period when supply of the power supply voltage VDD starts, and then changes to low level.

A high-level period of the activation signal STTPZ and a high-level period of the activation signal STTOZ are different. The power supply voltage VDD is supplied to another circuit coupled to an external terminal or the internal power supply control section 22. The ground voltage VSS is supplied to an internal circuit. The external power supply voltage VDD may be, for example, 1.8 V.

The internal power supply control section 22 receives the activation signals STTPZ and STTOZ, the power supply voltage VDD, the boost voltage VPP, a boost voltage VOO, and the reference voltage VREF and outputs a plurality of activation control signals for controlling the operation of the internal power supply generation section 24. The internal power supply generation section 24 receives the activation control signals from the internal power supply control section 22 and the power supply voltage VDD and generates the internal power supply voltage VIN and the boost voltages VPP and VOO. The internal power supply voltage VIN may be, for example, 1.8 V, the boost voltage VPP may be, for example, 2.7 V, and the boost voltage VOO may be, for example, 2.1 V. The internal power supply voltage VIN may be supplied to a circuit to which the power supply voltage VDD is not supplied.

For example, the boost voltage VPP may be supplied to a substrate of a pMOS transistor such as an n-type well region, in the memory core 30. For example, the boost voltage VPP may be supplied to a row decoder RDEC since the boost voltage VPP is used as the high-level voltage for a word line WL. For example, the boost voltage VOO may be used as a gate voltage for turning on an nMOS transistor which couples a bit line BL (or /BL) to a sense amplifier SA, in the memory core 30. The boost voltage VOO may be used as a gate voltage for turning on an nMOS transistor which couples the bit line BL (or /BL) to a precharge voltage line, in the memory core 30.

The data input-output buffer 26 outputs, to a data terminal DQ, read data transferred from the memory core 30 through data buses DB and IDQ in a read operation. The data input-output buffer 26 receives write data supplied through the data terminal DQ and transfers the received data to the memory core 30 through the data buses IDQ and DB in a write operation.

The data control section 28 includes, for example, a parallel-to-serial conversion circuit which operates in the read operation and a serial-to-parallel conversion circuit which operates in the write operation. The parallel-to-serial conversion circuit converts parallel read data output from the memory core 30 to the data bus DB into serial data, and sequentially outputs the serial data to the data bus IDQ. The serial-to-parallel conversion circuit converts serial write data sequentially supplied to the data bus IDQ into parallel data, and outputs the parallel data to the data bus DB. The ratio between the number of bits of the data bus DB and that of the data bus IDQ may be, for example, 4:1.

The memory core 30 includes a memory cell array ARY, the row decoder RDEC, a precharge circuit PRE, the sense amplifier SA, a column switch CSW, a column decoder CDEC, a read amplifier RA, and a write amplifier WA.

The memory cell array ARY includes a plurality of dynamic memory cells MC arranged in a matrix, a plurality of word lines WL coupled to a row of laterally aligned memory cells MC in FIG. 1, and a plurality of bit line pairs BL and /BL coupled to a column of longitudinally aligned memory cells MC in FIG. 1. Each memory cell MC includes a capacitor which holds data as electric charge and a transfer transistor which couples one end of the capacitor to the bit line BL (or /BL). The other end of the capacitor is coupled to a reference voltage line. A reference voltage to be supplied to the reference voltage line may be, for example, a precharge voltage. The memory cell array ARY may include a plurality of memory blocks which operate independently of each other.

The row decoder RDEC decodes the row address signal RAD in order to select the word line WL coupled to the memory cell MC to be accessed in the read operation, in the write operation, or in a refresh operation. The precharge circuit PRE sets each bit line pair BL and /BL coupled to the sense amplifier SA, which does not operate, to the precharge voltage. The sense amplifier SA operates in the read operation, in the write operation, or in the refresh operation and amplifies a voltage difference between the bit lines BL and /BL.

The column decoder CDEC decodes the column address signal CAD in order to select the bit line pair BL and /BL coupled to the memory cell MC to be accessed in the read operation and in the write operation. The column switch CSW couples the bit line pair BL and /BL to the read amplifier RA or write amplifier WA in accordance with the decoded signal from the column decoder CDEC.

The read amplifier RA amplifies complementary read data output through the column switch CSW in the read operation. The write amplifier WA amplifies complementary write data supplied through the data bus DB and supplies the complementary write data to the corresponding bit line pair BL and /BL, in the write operation.

Figure 2:
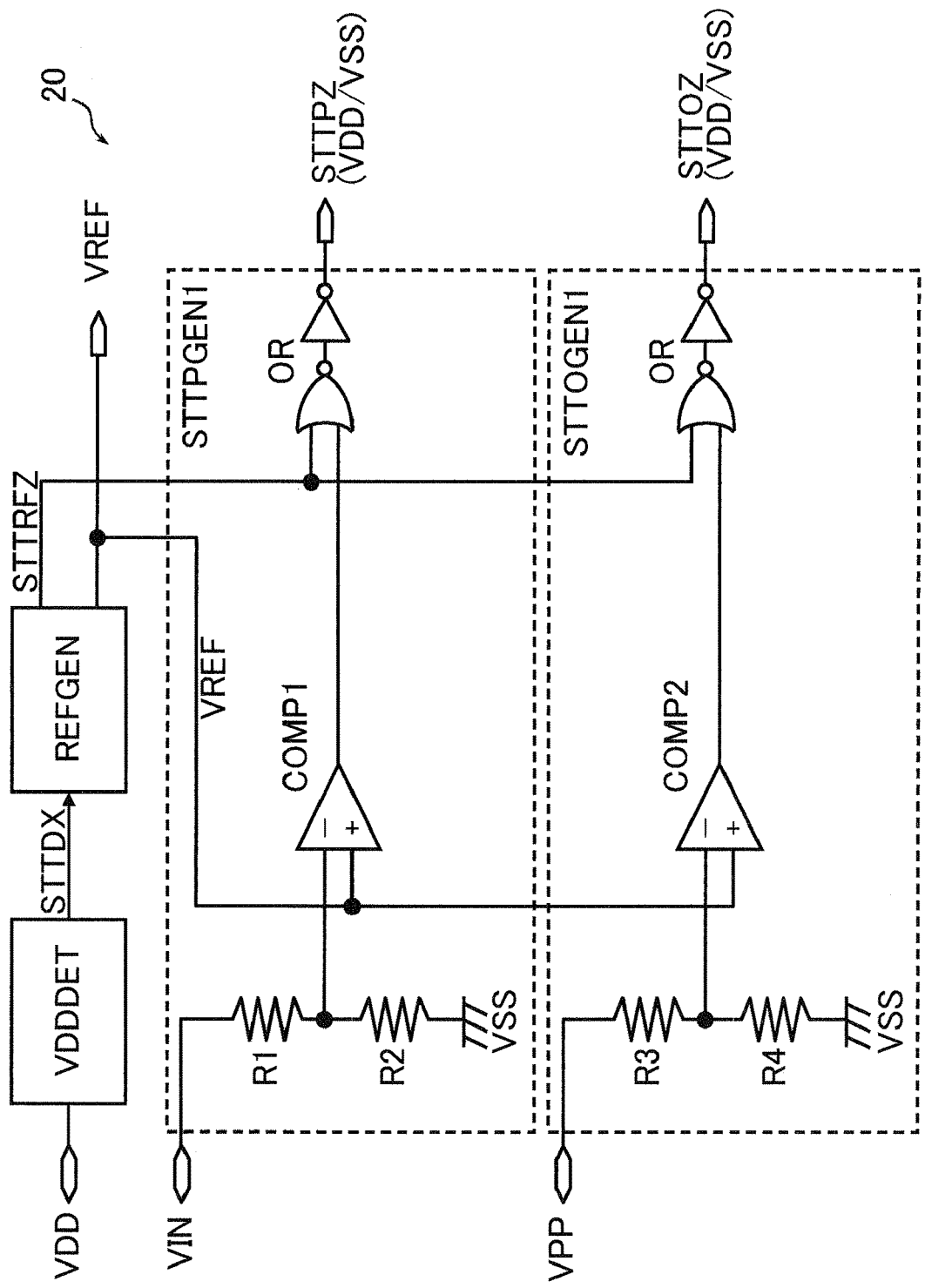
FIG. 2 illustrates an exemplary power-on control section.

FIG. 2 illustrates an exemplary power-on control section. The power-on control section illustrated in FIG. 2 may be the power-on control section 20 illustrated in FIG. 1. The power-on control section 20 includes a power supply detection circuit VDDDET, a reference voltage generation circuit REFGEN, and activation signal generation circuits STTPGEN1 and STTOGEN1. The power supply detection circuit VDDDET and reference voltage generation circuit REFGEN receive the power supply voltage VDD.

The power supply detection circuit VDDDET outputs an activation signal STTDX at a low level when the power supply voltage VDD is not more than a given value and outputs the activation signal STTDX at high level when the power supply voltage VDD exceeds the given value. The reference voltage generation circuit REFGEN generates the reference voltage VREF lower than the power supply voltage VDD when the activation signal STTDX is at a high level. The reference voltage generation circuit REFGEN outputs an activation signal STTRFZ at a high level when the reference voltage VREF is not more than a given value and outputs the activation signal STTRFZ at a low level when the reference voltage VREF exceeds the given value.

The activation signal generation circuit STTPGEN1 includes resistors R1 and R2, a comparator COMP1, and an OR circuit. The comparator COMP1 and OR circuit receive the power supply voltage VDD. The resistors R1 and R2 are series-coupled between an internal power supply line VIN and a ground line VSS, and output a monitor voltage generated by resistance division to the comparator COMP1. The comparator COMP1 outputs a high level signal when the monitor voltage is not more than the reference voltage VREF. The comparator COMP1 outputs a low level signal when the monitor voltage is higher than the reference voltage VREF. The OR circuit outputs the activation signal STTPZ at a high level when the activation signal STTRFZ is at a high level. The OR circuit outputs an output from the comparator COMP1 as the activation signal STTPZ when the activation signal STTRFZ is at a low level.

The activation signal generation circuit STTOGEN1 includes resistors R3 and R4, a comparator COMP2, and an OR circuit. The comparator COMP2 and OR circuit receive the power supply voltage VDD. The resistors R3 and R4 are series-coupled between a boost voltage line VPP and the ground line VSS, and output a monitor voltage generated by resistance division to the comparator COMP2. The comparator COMP2 outputs a high level signal when the monitor voltage is not more than the reference voltage VREF. The comparator COMP2 outputs a low level signal when the monitor voltage is higher than the reference voltage VREF. The OR circuit outputs the activation signal STTOZ at a high level when the activation signal STTRFZ is at a high level. The OR circuit outputs an output from the comparator COMP2 as the activation signal STTOZ when the activation signal STTRFZ is at a low level.

Figure 3:
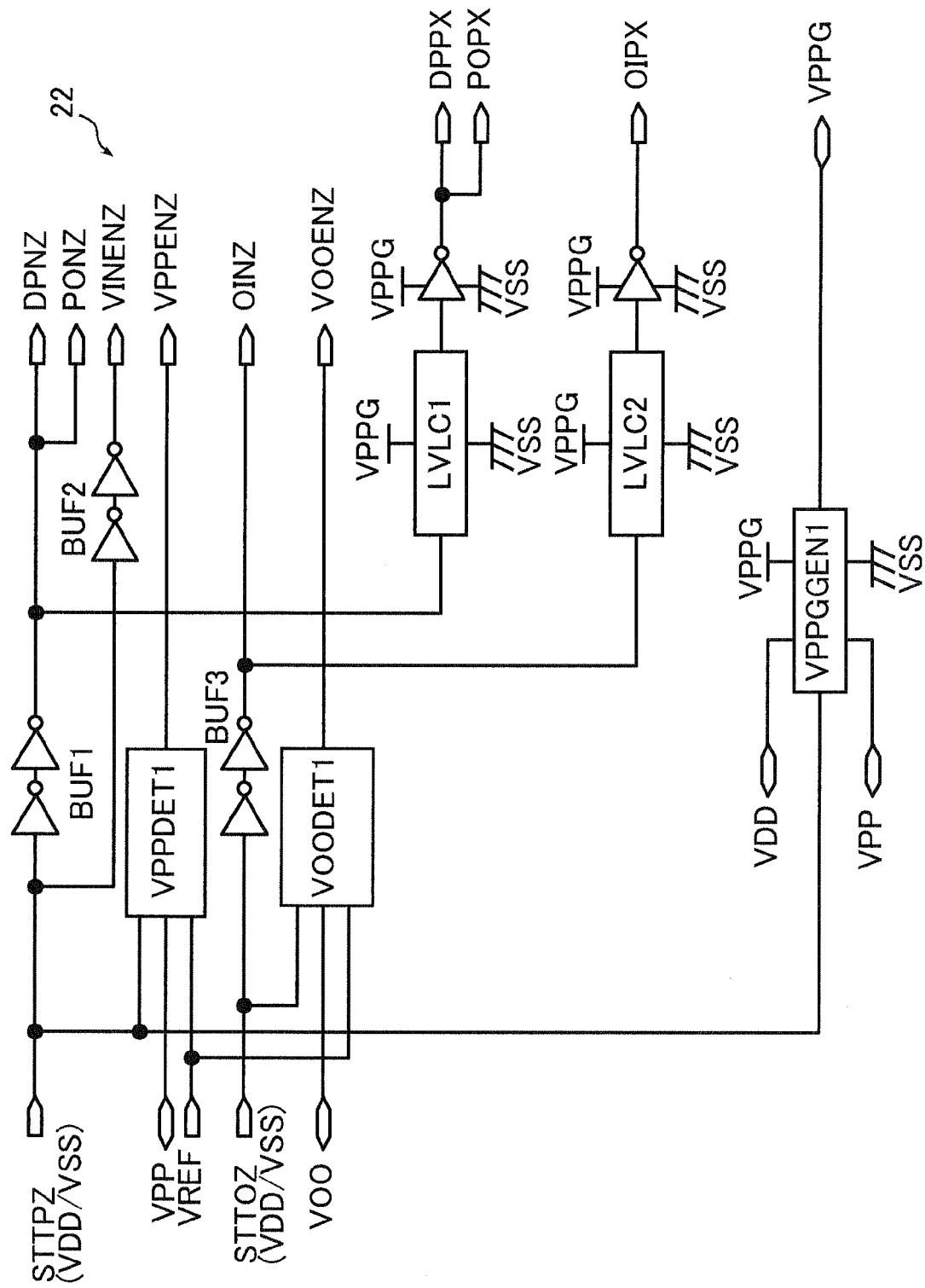
FIG. 3 illustrates an exemplary internal power supply control section.

FIG. 3 illustrates an exemplary internal power supply control section. The internal power supply control section illustrated in FIG. 3 may be the internal power supply control section 22 illustrated in FIG. 1. The internal power supply control section 22 includes voltage detection circuits VPPDET1 and VOODET1, level converters LVLC1 and LVLC2, a voltage generation circuit VPPGGEN1, and logical circuits. The inverters coupled to the outputs of the level converters LVLC1 and LVLC2 and the voltage generation circuit VPPGGEN1 receive a boost voltage VPPG. The other circuits may receive the power supply voltage VDD.

The internal power supply control section 22 outputs, as activation control signals DPNZ and PONZ, a signal obtained after the activation signal STTPZ is received by a buffer BUF1. The internal power supply control section 22 outputs, as an internal voltage enable signal VINENZ, a signal obtained after the activation signal STTPZ is received by a buffer BUF2. The internal power supply control section 22 outputs, as an activation control signal OINZ, a signal obtained after the activation signal STTOZ is received by a buffer BUF3.

The voltage detection circuit VPPDET1 outputs a boost enable signal VPPENZ at a low level when the activation signal STTPZ is at a high level, or when the boost voltage VPP exceeds a given value. The voltage detection circuit VPPDET1 outputs the boost enable signal VPPENZ at a high level when the activation signal STTPZ is at a low level, and the boost voltage VPP is not more than the given value.

The voltage detection circuit VOODET1 outputs a boost enable signal VOOENZ at a low level when the activation signal STTOZ is at a high level or when the boost voltage VOO exceeds a given value. The voltage detection circuit VOODET1 outputs the boost enable signal VOOENZ at a high level when the activation signal STTOZ is at a low level, and the boost voltage VOO is not more than the given value.

The level converter LVLC1 and the inverter coupled to the output of the level converter LVLC1 convert the high-level voltage of the activation control signals DPNZ and PONZ from the power supply voltage VDD to the boost voltage VPPG, and output the signals as activation control signals DPPX and POPX. The level converter LVLC2 and the inverter coupled to the output of the level converter LVLC2 convert the high-level voltage of the activation control signal OINZ from the power supply voltage VDD to the boost voltage VPPG, and output the signal as an activation control signal OIPX. The voltage generation circuit VPPGGEN1 couples a boost voltage line VPPG to the power supply voltage VDD or boost voltage line VPP in accordance with the voltage of the activation signal STTPZ.

The boost voltage VPPG is set to the power supply voltage VDD after power is turned on and is set to the boost voltage VPP after a pumping circuit VPPPMP starts operating. The high-level voltages of the activation control signals DPNZ, PONZ, and OIPX are set to the boost voltage VPPG.

Figure 4:
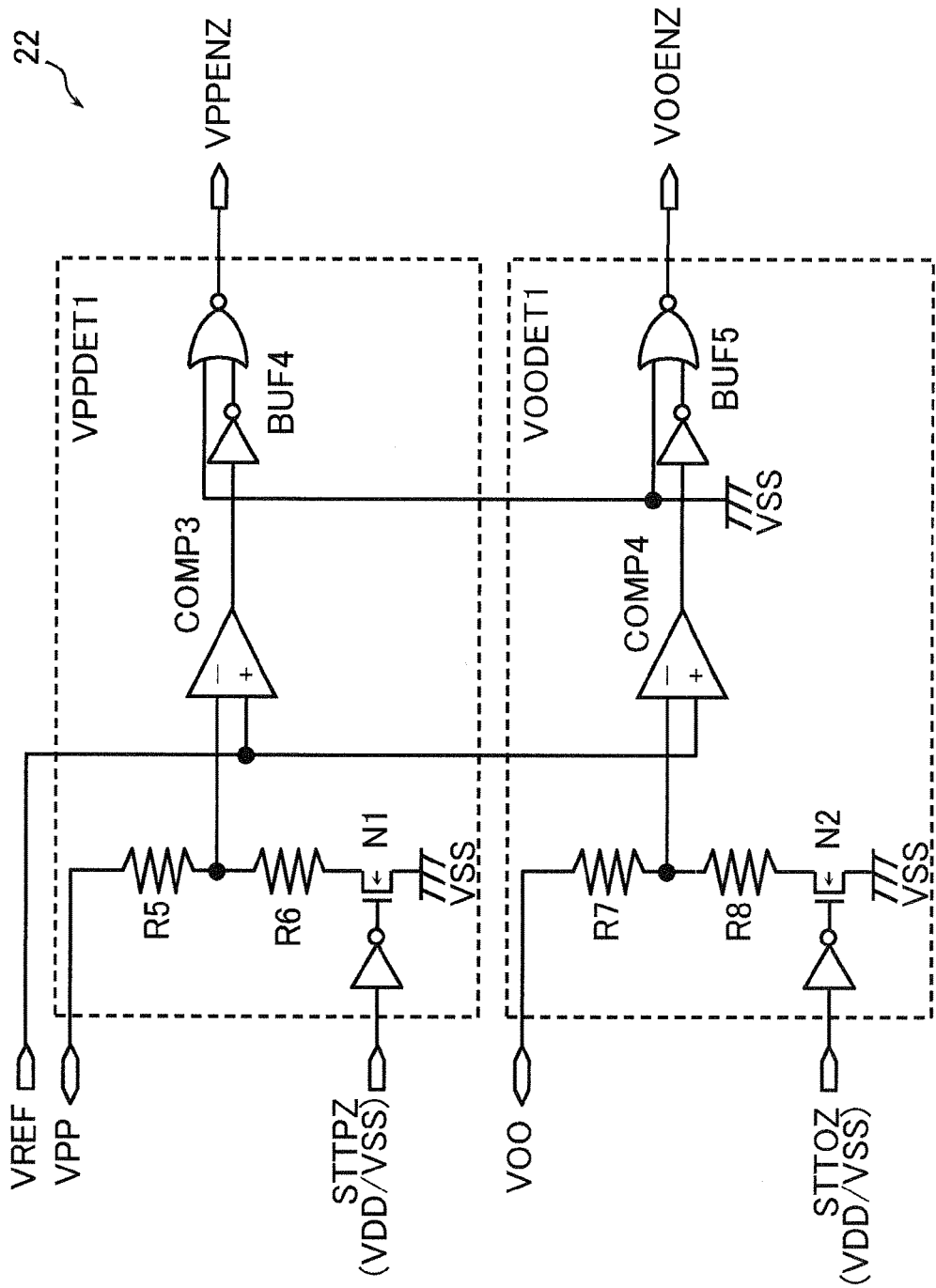
FIG. 4 illustrates exemplary voltage detection circuits.

FIG. 4 illustrates exemplary voltage detection circuits. The voltage detection circuits illustrated in FIG. 4 may be the voltage detection circuits VPPDET1 and VOODET1 illustrated in FIG. 3. The voltage detection circuit VPPDET1 includes resistors R5 and R6, an nMOS transistor N1, a comparator COMP3, and a buffer circuit BUF4. The resistors R5 and R6 and the nMOS transistor N1 are series-coupled between the boost voltage line VPP and the ground line VSS and output a monitor voltage generated by resistance division to the comparator COMP3. The comparator COMP3 outputs a high level signal when the monitor voltage is not more than the reference voltage VREF. The comparator COMP3 outputs a low level signal when the monitor voltage is higher than the reference voltage VREF. The buffer circuit BUF4 outputs an output from the comparator COMP3 as the boost enable signal VPPENZ. A substrate of the nMOS transistor N1, for example, a p-type well region, is coupled to the ground line VSS.

Figure 5:
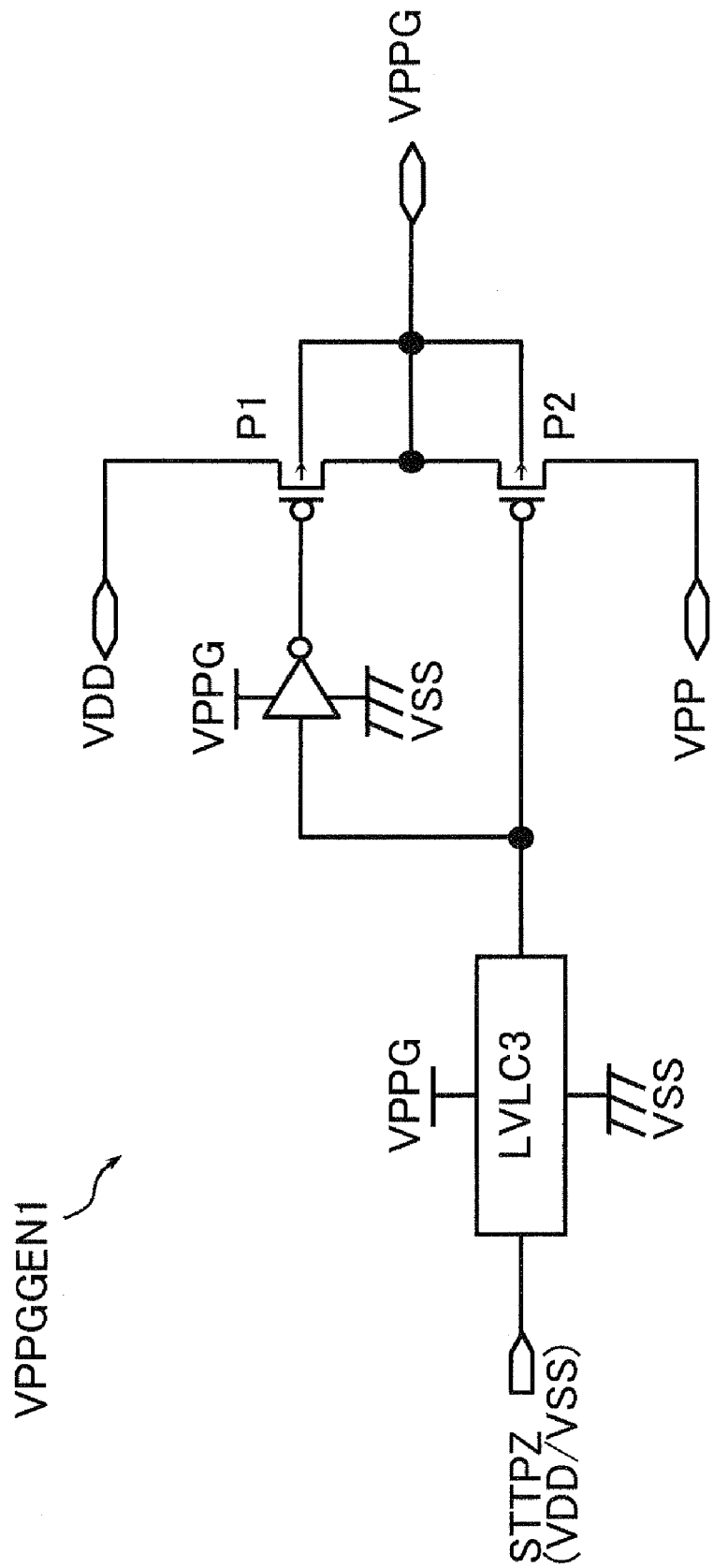
FIG. 5 illustrates an exemplary voltage generation circuit.

The voltage detection circuit VOODET1 includes resistors R7 and R8, an nMOS transistor N2, a comparator COMP4, and a buffer circuit BUF5. The resistors R7 and R8 and the nMOS transistor N2 are series-coupled between a boost voltage line VOO and the ground line VSS, and output a monitor voltage generated by resistance division to the comparator COMP4. The comparator COMP4 outputs a high level signal when the monitor voltage is not more than the reference voltage VREF. The comparator COMP4 outputs a low level signal when the monitor voltage is higher than the reference voltage VREF. The buffer circuit BUF5 outputs an output from the comparator COMP4 as the boost enable signal VOOENZ. A substrate of the nMOS transistor N2 is coupled to the ground line VSS. FIG. 5 illustrates an exemplary voltage generation circuit. The voltage generation circuit illustrated in FIG. 5 may be the voltage generation circuit VPPGGEN1 illustrated in FIG. 3. The voltage generation circuit VPPGGEN1 includes a level converter LVLC3 and pMOS transistors P1 and P2 series-coupled between a power supply line VDD and the boost voltage line VPP. The level converter LVLC3 converts the high-level voltage of the activation signal STTPZ from the power supply voltage VDD to the boost voltage VPPG. A gate of the transistor P1 is coupled to the output of the level converter LVLC3 through an inverter. A gate of the pMOS transistor P2 is coupled to the output of the level converter LVLC3. Drains and substrates of the transistors P1 and P2 are coupled to the boost voltage line VPPG.

The transistor P1 is turned on when the activation signal STTPZ is at a high level to couple the boost voltage line VPPG to the power supply line VDD. The transistor P2 is turned on when the activation signal STTPZ is at a low level to couple the boost voltage line VPPG to the boost voltage line VPP. The transistors P1 and P2 selectively couple the boost voltage line VPPG to the power supply line VDD or boost voltage line VPP depending on the level of the activation signal STTPZ.

Figure 6:
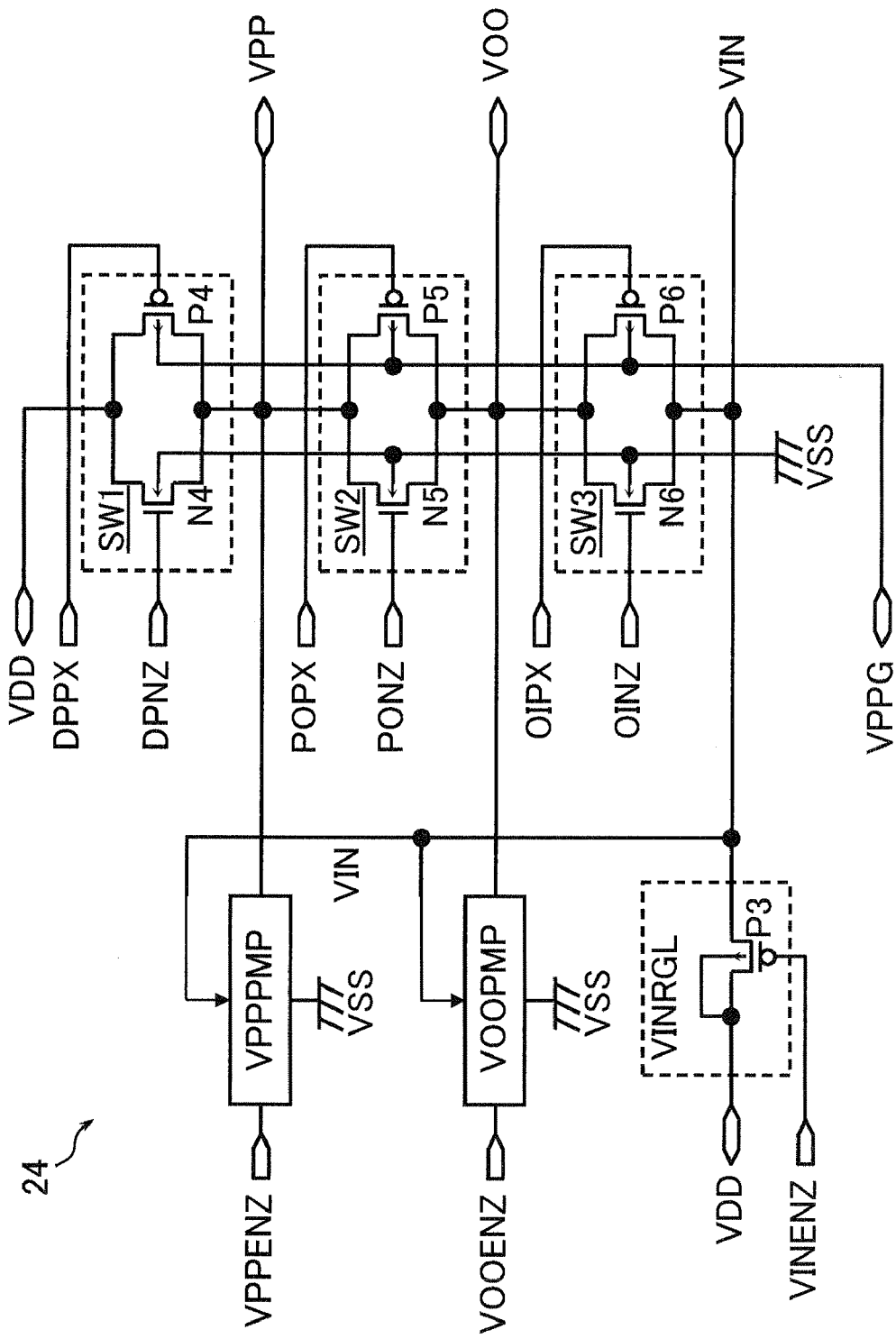
FIG. 6 illustrates an exemplary internal power supply generation section.

FIG. 6 illustrates an exemplary internal power supply generation section. The internal power supply generation section illustrated in FIG. 6 may be the internal power supply generation section 24 illustrated in FIG. 1. The internal power supply generation section 24 includes the pumping circuit VPPPMP, a pumping circuit VOOPMP, a regulator VINRGL, and switches SW1, SW2, and SW3.

The pumping circuit VPPPMP generates the boost voltage VPP when the boost enable signal VPPENZ is at a high level. The boost voltage VPP is generated by, for example, boosting the internal power supply voltage VIN by pumping operation using coupling capacitance. The pumping circuit VOOPMP generates the boost voltage VOO when the boost enable signal VOOENZ is at a high level. The boost voltage VOO is generated by, for example, boosting the internal power supply voltage VIN by pumping operation using coupling capacitance.

The regulator VINRGL includes a pMOS transistor P3. A gate of the transistor P3 receives the internal voltage enable signal VINENZ. A source and a substrate of the transistor P3 are coupled to the external power supply line VDD. A drain of the transistor P3 is coupled to the internal power supply line VIN.

The switches SW1, SW2, and SW3 each include a CMOS transfer gate. The CMOS transfer gates include pMOS transfer gates P4, P5, and P6 and nMOS transfer gates N4, N5, and N6. A pMOS transfer gate and an nMOS transfer gate may be referred to as a pMOS transistor and an nMOS transistor, respectively.

The switches SW1, SW2, and SW3 are series-coupled between the external power supply line VDD and the internal power supply line VIN through nodes VPP and VOO. In the switches SW1, SW2, and SW3, substrates of the nMOS transistors N4, N5, and N6 are coupled to the ground line VSS. In the switches SW1, SW2, and SW3, substrates of the pMOS transistors P4, P5, and P6 are coupled to the boost voltage line VPPG.

The switch SW1 is turned on when the switch SW1 receives the activation control signal DPNZ at a high level and the activation control signal DPPX at a low level to couple the boost voltage line VPP to the external power supply line VDD. The activation control signals DPNZ and DPPX may be complementary to each other. The switch SW2 is turned on when the switch SW2 receives the activation control signal PONZ at a high level and the activation control signal POPX at a low level to couple the boost voltage line VOO to the boost voltage line VPP. The activation control signals PONZ and POPX may be complementary to each other. The switch SW3 is turned on when the switch SW3 receives the activation control signal OINZ at a high level and the activation control signal OIPX at a low level to couple the internal power supply line VIN to the boost voltage line VOO. The activation control signals OINZ and OIPX may be complementary to each other.

The boost voltage VPPG is set to the power supply voltage VDD after power is turned on, and is set to the boost voltage VPP after the pumping circuit VPPPMP starts operating. For this reason, the voltage VPPG for the activation control signals DPPX, POPX, and OIPX, which are supplied to gates, does not become lower than a source voltage, for example, VDD or VPP in the pMOS transistors of the switches SW1 to SW3 illustrated in FIG. 6. Since the high-level voltages of the activation control signals DPNZ, PONZ, and OIPX are set to the boost voltage VPPG, the pMOS transistors of the switches SW1 to SW3 illustrated in FIG. 6 are securely turned off.

Figure 7:
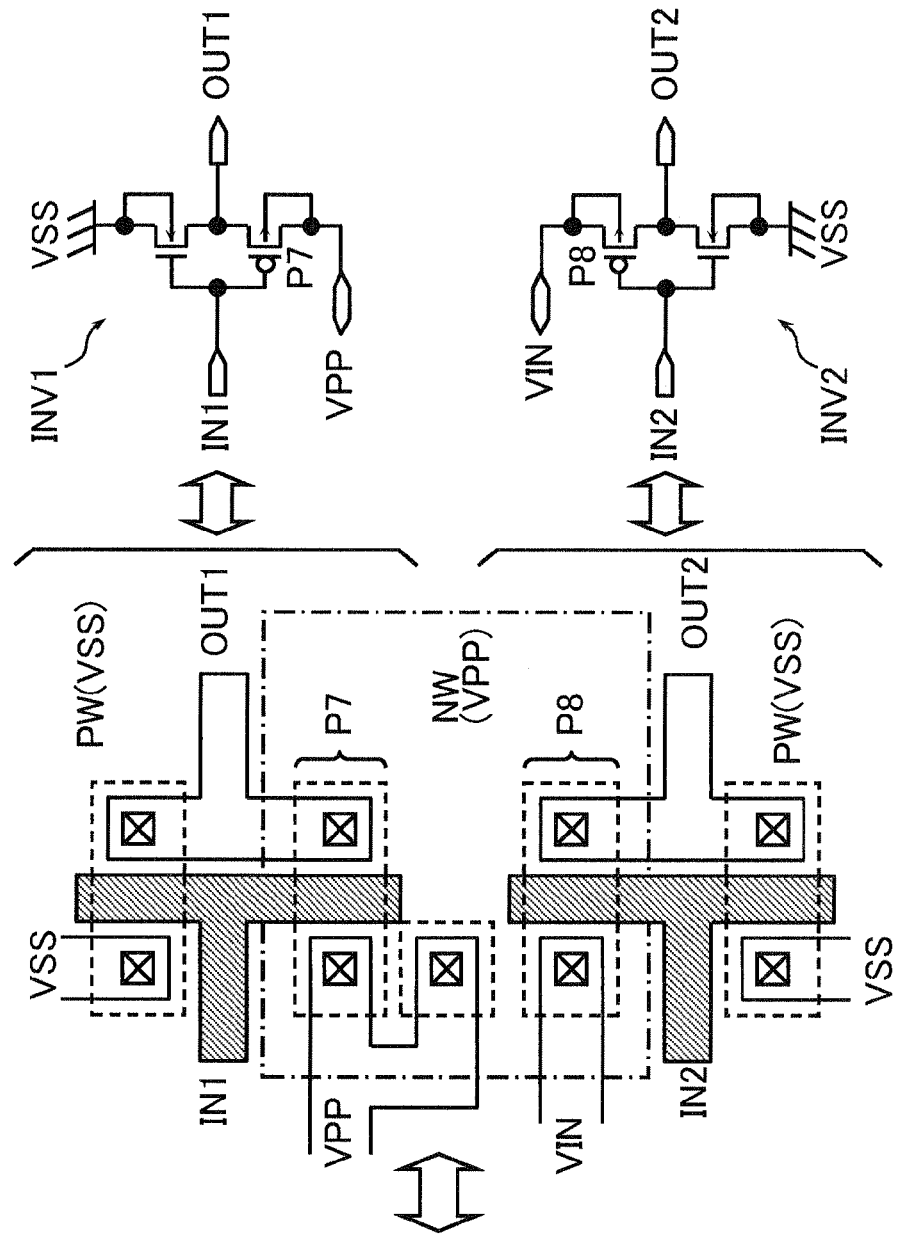
FIGS. 7A to 7C illustrate exemplary transistors.

FIG. 7 illustrates an exemplary transistor. FIG. 7B illustrates an exemplary layout of transistors. The transistors illustrated in FIG. 7B may be transistors in the memory core 30 illustrated in FIG. 1. FIG. 7A illustrates an exemplary section corresponding to the layout in FIG. 7B, and FIG. 7C illustrates an exemplary circuit corresponding to the layout in FIG. 7B. Each shaded region represents gate wiring of a transistor. Each region enclosed in solid lines represents metal wiring. Each region enclosed in broken lines represents an n-type diffusion layer n+ or a p-type diffusion layer p+. The region enclosed in dashed lines represents an n-type well region NW. A region around the n-type well region NW may form a p-type well region PW. The n-type well region NW may serve as a substrate of a pMOS transistor while the p-type well region PW may serve as a substrate of an nMOS transistor. The p-type well PW, for example, a substrate of an nMOS transistor may be set to the ground voltage VSS.

FIGS. 7A to 7C illustrate two CMOS inverters INV1 and INV2 formed in the memory core 30. A source of a pMOS transistor P7 of the CMOS inverter INV1 is coupled to the boost voltage line VPP. A source of a pMOS transistor P8 of the CMOS inverter INV2 is coupled to the internal power supply line VIN. Forming the pMOS transistors P7 and P8, which receive different source voltages, in the common n-type well region NW causes a reduction in chip size. If the pMOS transistors P7 and P8 whose source voltages are different are formed in the common well region NW, the well region NW may be set to the highest voltage, for example, the boost voltage VPP.

If the voltage at the n-type well region NW becomes lower than the source voltage or drain voltage of each of the pMOS transistors P7 and P8, a forward voltage may be applied to a pn junction, and a substrate current may flow. The substrate current may cause a malfunction such as latch-up. The boost voltage VPP supplied to the well region NW may be higher than the voltage at the internal power supply line VIN even during an unstable period, such as at the time of power-on.

Figure 8:
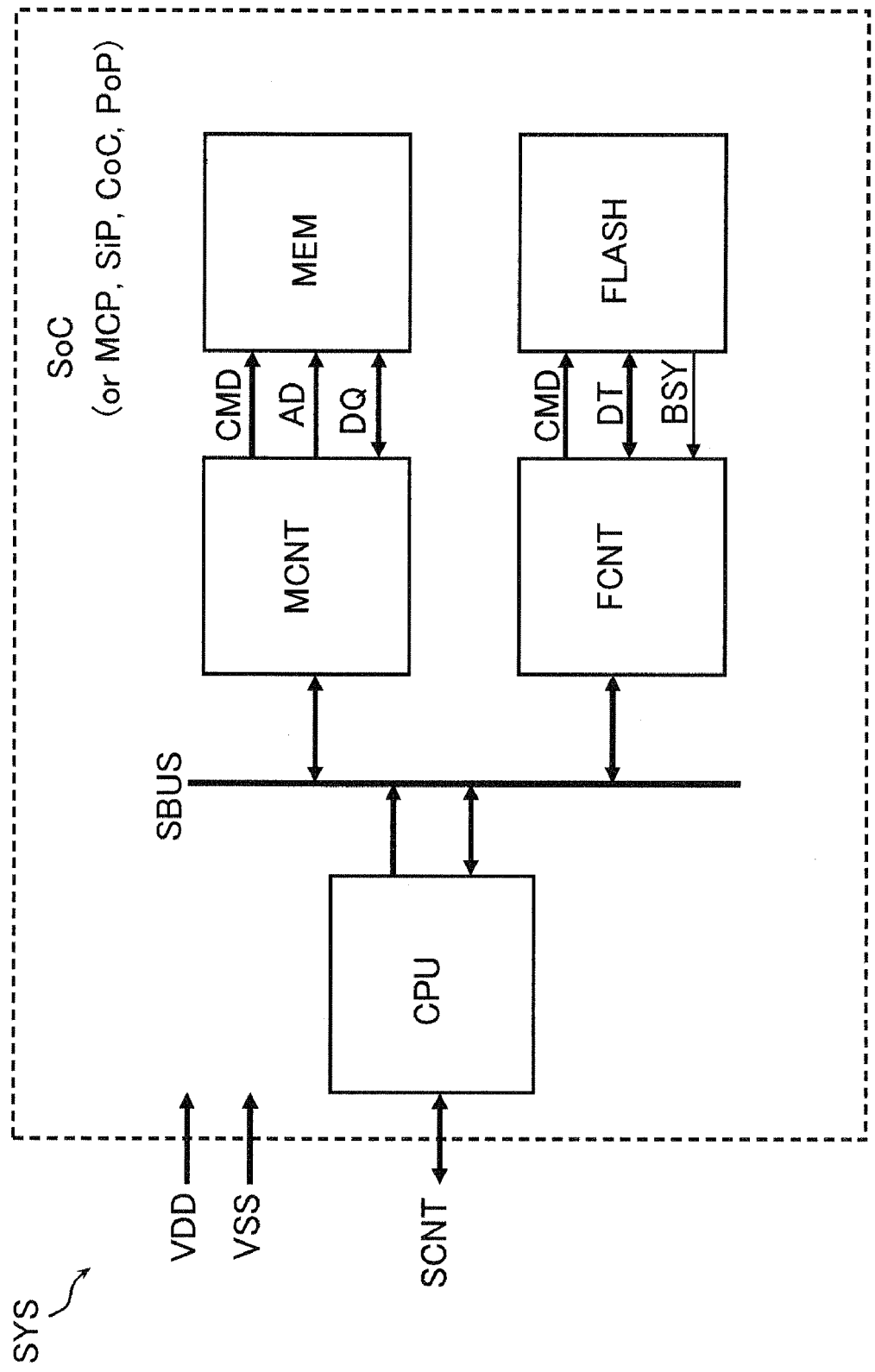
FIG. 8 illustrates an exemplary system including a semiconductor memory.

FIG. 8 illustrates an exemplary system including a semiconductor memory. The semiconductor memory illustrated in FIG. 8 may be the semiconductor memory MEM illustrated in FIG. 1. The system SYS may be, for example, a user system, and may include, for example, handheld equipment such as a cellular phone or handheld game. The system SYS may include at least a part of a video recorder or a computer device such as a personal computer.

The system SYS may include a System-on-Chip (SoC). The system SYS may include a Multi-Chip-Package (MCP), a System-in-Package (SiP), a Chip-on-Chip (CoC), a Package-on-Package (PoP), or a printed board. The system SYS may be coupled to the power supply line VDD or ground line VSS.

For example, the SoC includes the semiconductor memory MEM, a memory controller MCNT which accesses the semiconductor memory MEM, a flash memory FLASH, a memory controller FCNT which accesses the flash memory FLASH, and a CPU, which controls the entire system, such as a main controller. The CPU and the memory controllers MCNT and FCNT are coupled to each other through a system bus SBUS. The SoC is coupled to a host system through an external bus SCNT. Another peripheral circuit chip may be coupled to the system bus SBUS. The CPU, semiconductor memory MEM, flash memory FLASH, and memory controllers MCNT and FCNT may receive the power supply voltage VDD.

The CPU outputs a read packet such as a read access request and a write packet such as a write access request to the memory controller MCNT in order to access the semiconductor memory MEM. The memory controller MCNT outputs the command signal CMD, address signal AD, and a write data signal DQ to the semiconductor memory MEM and receives a read data signal DQ from the semiconductor memory MEM, in accordance with an instruction from the CPU. If the semiconductor memory MEM is a DRAM, the memory controller MCNT periodically outputs a refresh command to the semiconductor memory MEM.

The CPU outputs a read packet such as a read access request, a write packet such as a write access request, and an erase packet such as an erase request) to the memory controller FCNT in order to access the flash memory FLASH. The memory controller FCNT outputs the command signal CMD and a write data signal DT to the flash memory FLASH and receives a read data signal DT and a busy signal BSY from the flash memory FLASH, in accordance with an instruction from the CPU. The address signal is transmitted to the flash memory FLASH through a data line DT.

The system SYS may not include the memory controller MCNT, and the CPU may output the command signal CMD and address signal AD to the semiconductor memory MEM. The system SYS may have a CPU and the semiconductor memory MEM. The CPU operates as, for example, a memory controller.

Figure 9:
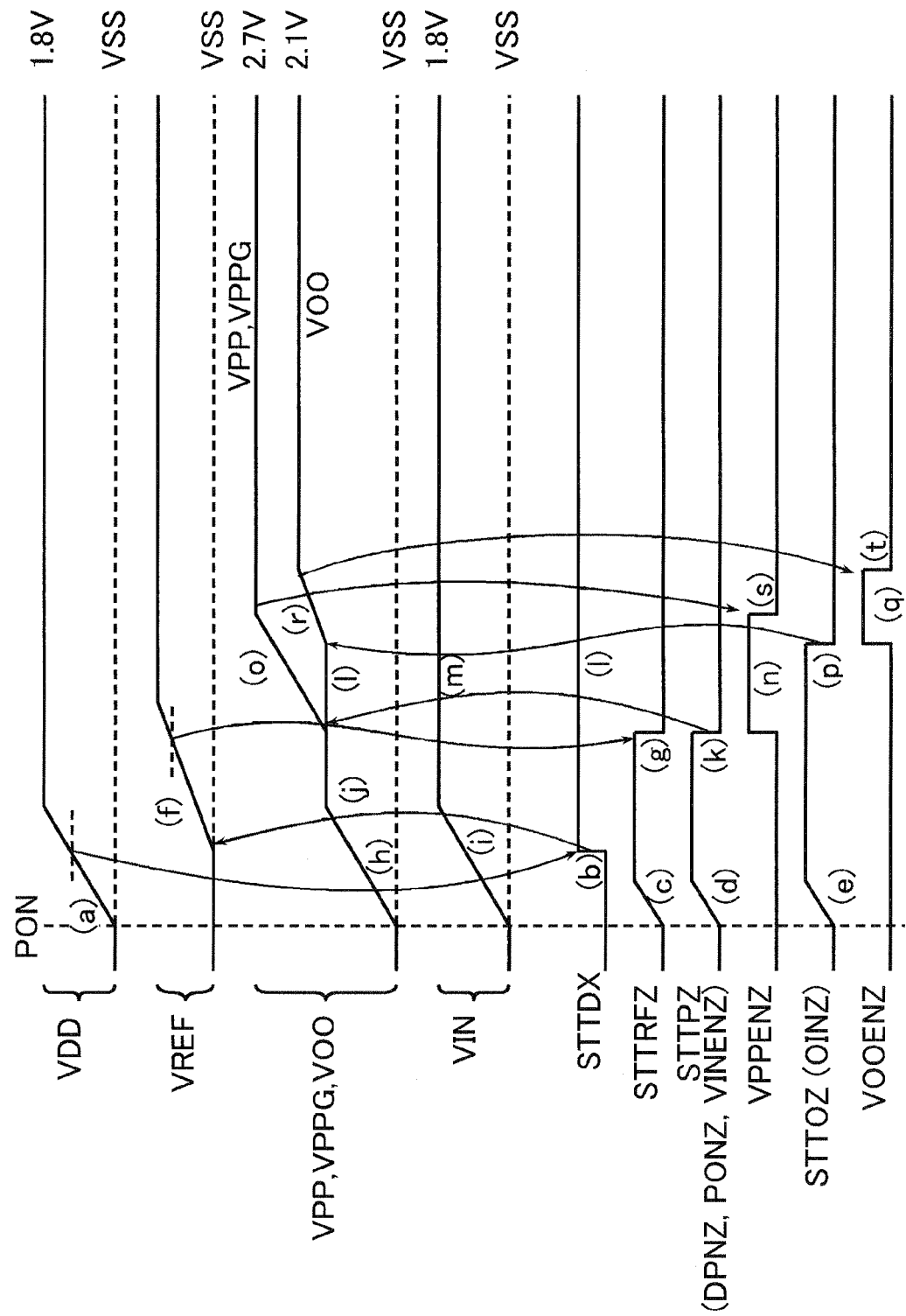

FIG. 9 illustrates an exemplary operation of the semiconductor memory MEM when power is turned on. A semiconductor memory illustrated in FIG. 9 may be the semiconductor memory MEM illustrated in FIG. 1. When the system SYS illustrated in FIG. 8 is powered on, the power supply voltage VDD rises gradually ((a) in FIG. 9). The power supply detection circuit VDDDET illustrated in FIG. 2 changes the activation signal STTDX from low level to high level when the power supply voltage VDD exceeds the given value ((b) in FIG. 9).

The reference voltage generation circuit REFGEN illustrated in FIG. 2 generates the activation signal STTRFZ, which follows the power supply voltage VDD ((c) in FIG. 9). The activation signal generation circuit STTPGEN1 illustrated in FIG. 2 generates the activation signal STTPZ, which follows the power supply voltage VDD, while the activation signal STTRFZ is at a high level ((d) in FIG. 9). The activation signal generation circuit STTOGEN1 generates the activation signal STTOZ, which follows the power supply voltage VDD ((e) in FIG. 9). The OR circuits illustrated in FIG. 2 set the activation signals STTPZ and STTOZ at a high level while the activation signal STTRFZ is at a high level. The activation signals STTPZ and STTOZ are prevented from changing to a low level based on outputs from the comparators COMP1 and COMP2 during a power-on period when the comparators COMP1 and COMP2 illustrated in FIG. 2 become unstable.

The reference voltage generation circuit REFGEN starts generating the reference voltage VREF in synchronism with a leading edge of the activation signal STTDX ((f) in FIG. 9). The reference voltage generation circuit REFGEN changes the activation signal STTRFZ to a low level when the reference voltage VREF exceeds the given value ((g) in FIG. 9). After that, the activation signals STTPZ and STTOZ change in response to the outputs from the comparators COMP1 and COMP2.

While the activation signal STTPZ is at a high level, the activation control signals DPNZ and PONZ and the internal voltage enable signal VINENZ are set at a high level, and the activation control signals DPPX and POPX are set at a low level. The level of the activation control signals DPPX and POPX is opposite to that of the activation control signal DPNZ or PONZ. While the activation signal STTOZ is at a high level, the activation control signal OINZ is set at a high level, and the activation control signal OIPX is set at a low level. The level of the activation control signal OIPX is opposite to that of the activation control signal OINZ. Accordingly, for example, the switches SW1 to SW3 illustrated in FIG. 6 are turned on while the regulator VINRGL is turned off.

Since the switches SW1 to SW3 are turned on, the power supply line VDD is sequentially coupled to the boost voltage line VPP, boost voltage line VOO, and internal power supply line VIN. The boost voltages VPP and VOO and the internal power supply voltage VIN follow the power supply voltage VDD and rise ((h) and (i) in FIG. 9). The boost voltage lines VPP and VOO and the internal power supply line VIN are coupled to the power supply line VDD through the CMOS transfer gates of the switches SW1 to SW3. For this reason, the boost voltages VPP and VOO and the internal power supply voltage VIN become substantially equal to the power supply voltage VDD without being affected by the threshold voltages of the transistors.

Since the boost voltage line VOO is coupled to the power supply line VDD through the boost voltage line VPP, the boost voltage VOO does not become higher than the boost voltage line VPP in the middle of the rise. Since the internal power supply line VIN is coupled to the power supply line VDD through the boost voltage lines VOO and VPP, the internal power supply line VIN does not become higher than the boost voltage line VOO in the middle of the rise. For example, during the power-on period, the drain voltage (VIN) of the pMOS transistor P8 illustrated in FIG. 7 may not become higher than a substrate voltage (VPP) (NW). Since a forward current does not flow to the pn junction of the pMOS transistor P8, the semiconductor memory MEM is prevented from malfunctioning. Latch-up caused by a forward current does not occur.

The voltage generation circuit VPPGGEN1 illustrated in FIG. 5 couples the boost voltage line VPPG to the power supply line VDD while the activation signal STTPZ is at a high level. The boost voltage VPPG follows the power supply voltage VDD to rise ((j) in FIG. 9). Since the boost voltage VPPG is set not to the boost voltage VPP but to the power supply voltage VDD at the beginning of the power-on period, the drain voltage (VPP) of the pMOS transistor P5 of the switch SW2 does not become higher than a substrate voltage (VPPG). A forward voltage is not applied to a pn junction of the pMOS transistor of the switch SW2, and thus a substrate current does not flow.

If the boost voltage line VPPG is coupled to the boost voltage line VPP by the pMOS transistor P2 illustrated in FIG. 5, the boost voltage VPPG may temporarily become lower than the boost voltage VPP. At this time, a forward current may flow to the pn junction of the pMOS transistor P5 of the switch SW2.

The activation signal generation circuit STTPGEN1 changes the activation signal STTPZ to a low level ((k) in FIG. 9) when the activation signal STTRFZ changes to a low level, and then the monitor voltage becomes higher than the reference voltage VREF. The reference voltage VREF may follow the power supply voltage VDD. For this reason, the activation signal STTPZ changes to a low level when the monitor voltage generated from the internal power supply voltage VIN by resistance division rises to a given voltage.

The activation control signals DPNZ and PONZ, and the internal voltage enable signal VINENZ, are set to a low level while the activation control signals DPPX and POPX are set to a high level, in response to the change of the activation signal STTPZ to a low level. The switches SW1 and SW2 illustrated in FIG. 6 are turned off, and the regulator VINRGL is turned on. The turned-off switch SW1 causes the boost voltage line VPP to be disconnected from the power supply line VDD. The turned-off switch SW2 causes the boost voltage line VOO to be disconnected from the power supply line VDD and boost voltage line VPP. The switch SW3 is on, and the regulator VINRGL is on. For this reason, the boost voltage VOO and internal power supply voltage VIN are held at the power supply voltage VDD ((l) and (m) in FIG. 9).

The boost voltages VPP, VPPG, and VOO, and the internal power supply voltage VIN rise with a rise in the external power supply voltage VDD and become substantially equal to the external power supply voltage VDD. Since a leak current does not flow to a pn junction of each transistor, the semiconductor memory MEM is prevented from malfunctioning.

The voltage detection circuit VPPDET1 illustrated in FIG. 4 holds the boost enable signal VPPENZ at a high level from when the activation signal STTPZ changes to a low level to when the boost voltage VPP rises to a given voltage ((n) in FIG. 9). The pumping circuit VPPPMP illustrated in FIG. 6 performs pumping operation while the boost enable signal VPPENZ is at a high level. The boost voltage VPP rises ((o) in FIG. 9).

The voltage generation circuit VPPGGEN1 disconnects the boost voltage line VPPG from the power supply line VDD and couples the boost voltage line VPPG to the boost voltage line VPP, in response to the change of the activation signal STTPZ to a low level. After that, the boost voltage VPPG changes to follow the boost voltage VPP. When the pumping circuit VPPPMP starts generating the boost voltage VPP, the power supply voltage VDD and the boost voltage VPP become stable. For this reason, the boost voltage VPP may not become higher than the boost voltage VPPG. Since a voltage not less than a forward voltage drop is not applied to the pn junction of the pMOS transistor of the switch SW2, the semiconductor memory MEM does not malfunction.

After the activation signal STTRFZ changes to low level, the activation signal generation circuit STTOGEN1 illustrated in FIG. 2 changes the activation signal STTOZ to a low level ((p) in FIG. 9) when the monitor voltage becomes higher than the reference voltage VREF. The reference voltage VREF follows the power supply voltage VDD. The activation signal STTOZ changes to a low level when the monitor voltage generated from the boost voltage VPP by resistance division rises to a given voltage. The activation control signal OINZ is set to a low level while the activation control signal OIPX is set to a high level, in response to the change of the activation signal STTOZ to a low level. The switch SW3 is turned off. The turned-off switch SW3 causes the boost voltage line VOO to be disconnected from the internal power supply line VIN and power supply line VDD.

The voltage detection circuit VOODET1 illustrated in FIG. 4 holds the boost enable signal VOOENZ at a high level from when the activation signal STTOZ changes to a low level to when the boost voltage VOO rises to a given voltage ((q) in FIG. 9). The pumping circuit VOOPMP illustrated in FIG. 6 performs pumping operation while the boost enable signal VOOENZ is at a high level. The boost voltage VOO rises ((r) in FIG. 9).

When the boost voltage VPP rises to a given voltage, the boost enable signal VPPENZ changes to a low level ((s) in FIG. 9). The pumping circuit VPPPMP stops pumping operation in response to the change of the boost enable signal VPPENZ to a low level. After that, since the pumping circuit VPPPMP operates or stops depending on the boost voltage VPP, the boost voltage VPP is held at a constant voltage. When the boost voltage VOO rises to the given voltage, the boost enable signal VOOENZ changes to a low level ((t) in FIG. 9). The pumping circuit VOOPMP stops pumping operation in response to the change of the boost enable signal VOOENZ to a low level. After that, since the pumping circuit VOOPMP operates or stops depending on the boost voltage VOO, the boost voltage VOO is held at a constant voltage.

Since, in the first embodiment, the boost voltages VPP, VOO, and VPPG, and the internal power supply voltage VIN become substantially equal to the external power supply voltage VDD when power is turned on, a substrate current does not flow to a pn junction of a pMOS transistor. A substrate current does not flow to a pn junction of a pMOS transistor having a substrate, for example, the n-type well region NW to which the boost voltage VPP or VPPG is supplied. For this reason, an internal circuit including a pMOS transistor is prevented from malfunctioning when power is turned on, and the semiconductor memory MEM is also prevented from malfunctioning. Since the CMOS transfer gates of the switches SW1 to SW3 allow the boost voltage lines VPP and VOO and the internal power supply line VIN to be coupled to the power supply line VDD, the boost voltages VPP, VOO, and VPPG and the internal power supply voltage VIN may become substantially equal to the power supply voltage VDD.

Figure 10:
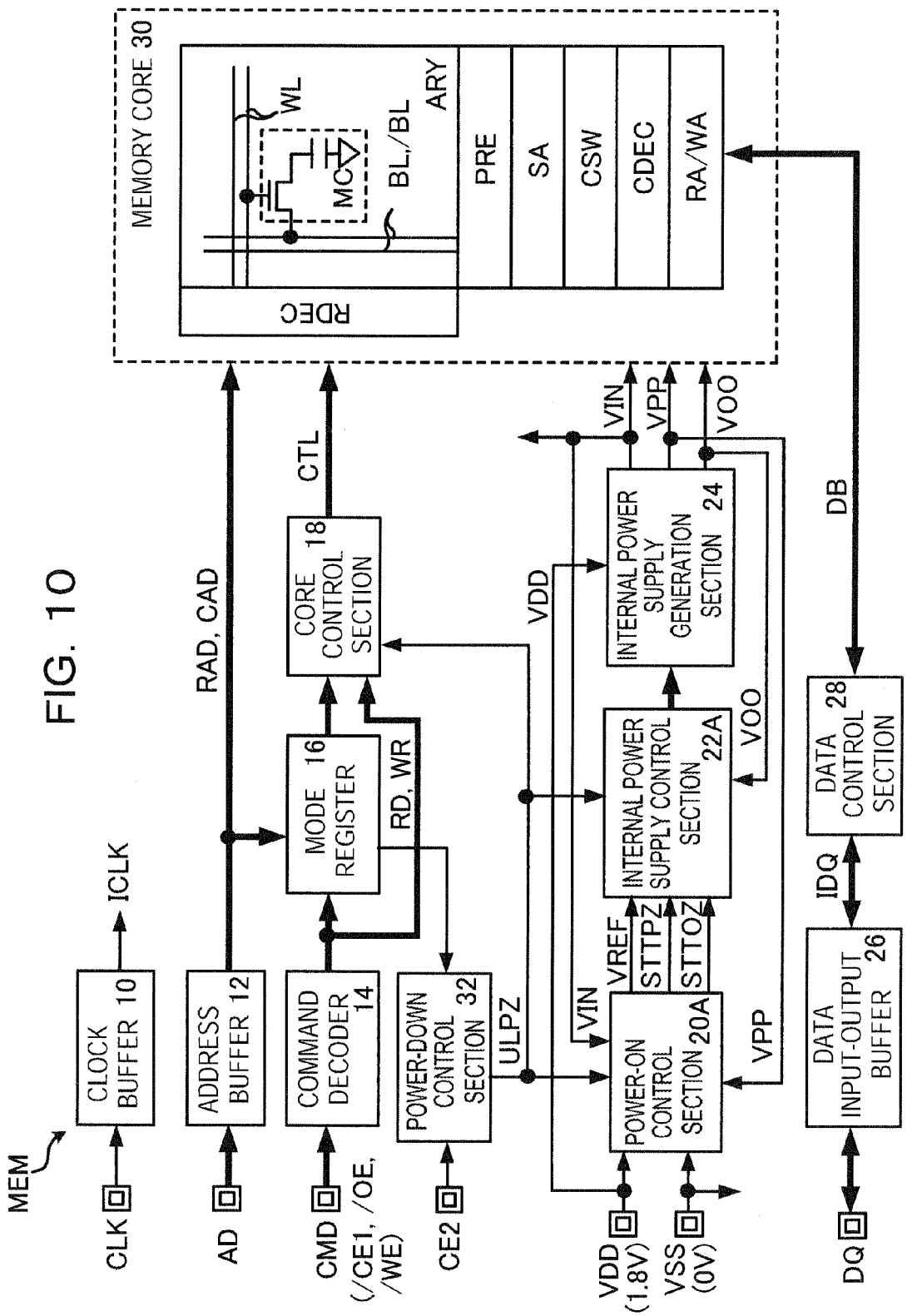
FIG. 10 illustrates a second embodiment.

FIG. 10 illustrates a second embodiment. The same elements as those in the previous embodiment are denoted by the same reference numerals, and a description thereof will be omitted or reduced. For example, a semiconductor device may be a semiconductor memory MEM such as a pseudo SRAM. The semiconductor memory MEM may include a power-on control section 20A and an internal power supply control section 22A. The power-on control section 20A and internal power supply control section 22A may correspond to the power-on control section 20 and internal power supply control section 22 illustrated in FIG. 1. The semiconductor memory MEM may include a power-down control section 32. The configuration of the rest of the semiconductor memory MEM may be substantially identical or similar to that of a corresponding part illustrated in FIG. 1.

The semiconductor memory MEM may operate in synchronism with a clock signal CLK or may operate asynchronously with the clock signal CLK. The semiconductor memory MEM may include a memory macro (IP) mounted in a system LSI or the like, and may include a semiconductor storage device enclosed in a package. For example, the semiconductor memory MEM may be mounted in a system SYS illustrated in FIG. 8.

The power-down control section 32 activates a low power signal ULPZ to a high level while the power-down control section 32 receives a chip enable signal CE2 at a low level through an external terminal. The low power signal ULPZ is supplied to the power-on control section 20A, internal power supply control section 22A, and the like. The power-down control section 32 deactivates the low power signal ULPZ to low level while the power-down control section 32 receives the chip enable signal CE2 at a high level. With the low power signal ULPZ at a high level, the semiconductor memory MEM shifts the operation mode from a normal operation mode NRM to a low power consumption mode PD. The chip enable signal CE2 places the semiconductor memory MEM into the low power consumption mode PD. The chip enable signal CE2 is output from a CPU or a memory controller MCNT illustrated in FIG. 8. The chip enable signal CE2 may be a command signal CMD.

Figure 11:
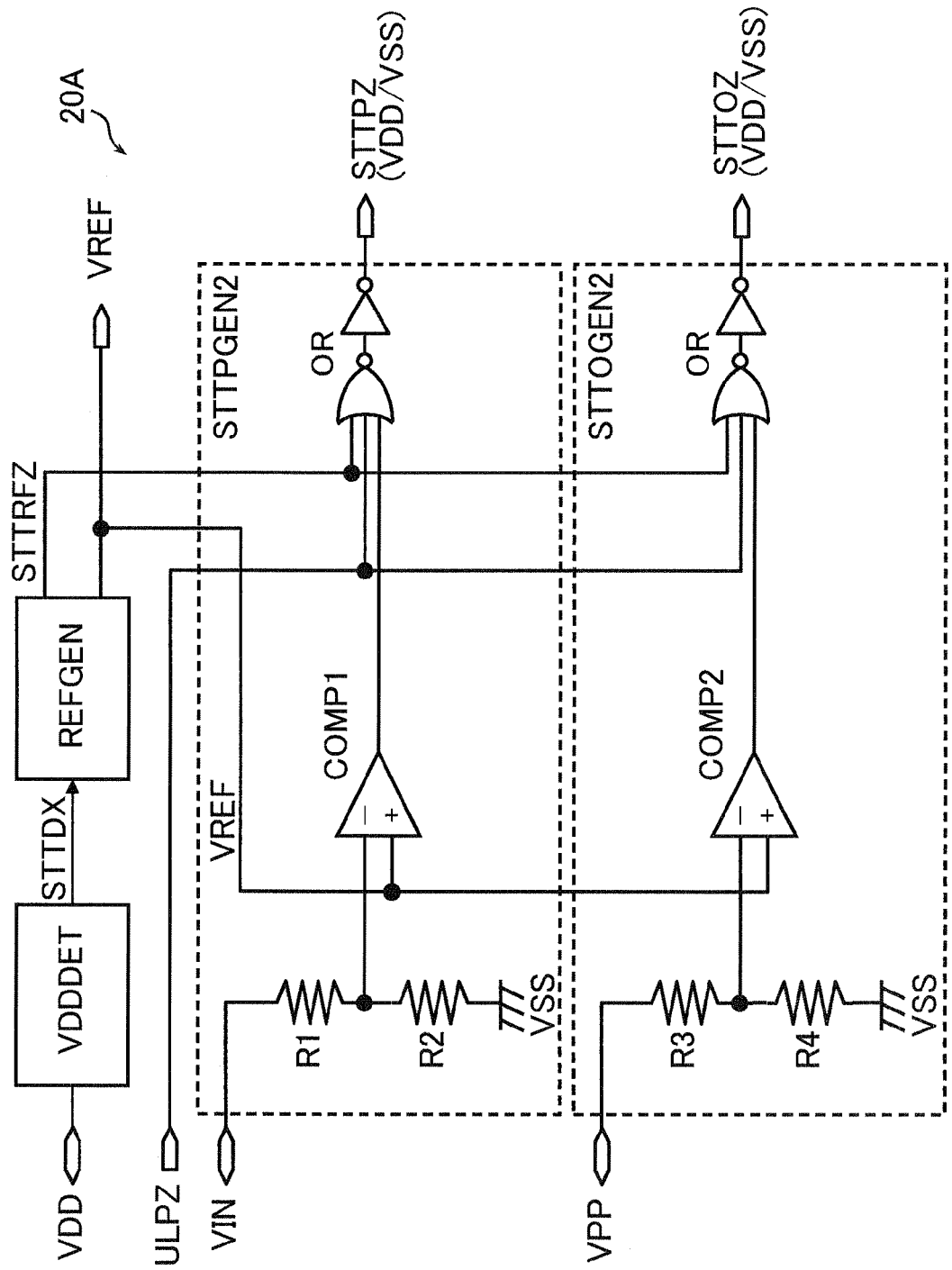
FIG. 11 illustrates an exemplary power-on control section.

FIG. 11 illustrates an exemplary power-on control section. The power-on control section illustrated in FIG. 11 may be the power-on control section 20A illustrated in FIG. 10. A description of those elements in FIG. 11 that are the same as those illustrated in FIG. 2 will be omitted or reduced. The power-on control section 20A includes activation signal generation circuits STTPGEN2 and STTOGEN2. The activation signal generation circuits STTPGEN2 and STTOGEN2 may correspond to the activation signal generation circuits STTPGEN1 and STTOGEN1 illustrated in FIG. 2. The activation signal generation circuits STTPGEN2 and STTOGEN2 may be substantially identical to the activation signal generation circuits STTPGEN1 and STTOGEN1 illustrated in FIG. 2 except that each OR circuit has three inputs. The configuration of the rest of the power-on control section 20A may be substantially identical or similar to that of a corresponding part of the power-on control section 20.

Each OR circuit receives the low power signal ULPZ at an input terminal. The activation signal generation circuit STTPGEN2 holds an activation signal STTPZ at a high level when the activation signal generation circuit STTPGEN2 receives the low power signal ULPZ at a high level. The activation signal generation circuit STTOGEN2 holds the activation signal STTOZ at a high level when the activation signal generation circuit STTOGEN2 receives the low power signal ULPZ at a high level.

Figure 12:
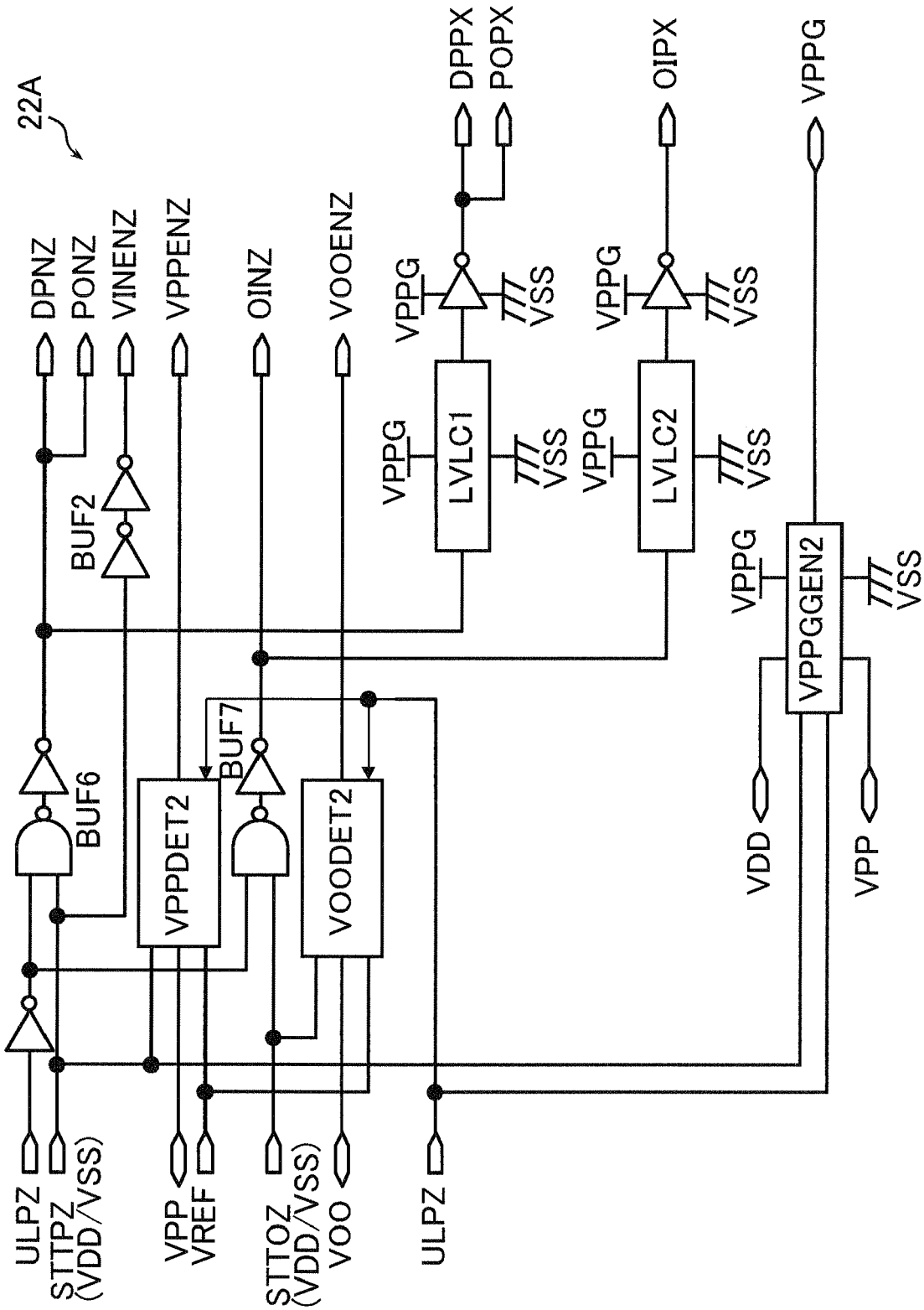
FIG. 12 illustrates an exemplary internal power supply control section.

FIG. 12 illustrates an exemplary internal power supply control section. The internal power supply control section illustrated in FIG. 12 may be the internal power supply control section 22A illustrated in FIG. 10. A description of those elements in FIG. 12 that are the same as those illustrated in FIG. 3 will be omitted or reduced. The internal power supply control section 22A includes buffers BUF6 and BUF7, voltage detection circuits VPPDET2 and VOODET2, and a voltage generation circuit VPPGGEN2. The buffers BUF6 and BUF7, voltage detection circuits VPPDET2 and VOODET2, and voltage generation circuit VPPGGEN2 may correspond to the buffers BUF1 and BUF3, voltage detection circuits VPPDET1 and VOODET1, and voltage generation circuit VPPGGEN1. The buffers BUF6 and BUF7 may be AND circuits.

The buffer BUF6 receives a signal obtained by inverting the logic of the low power signal ULPZ and the activation signal STTPZ and outputs an operation result as activation control signals DPNZ and PONZ. The buffer BUF7 receives a signal obtained by inverting the logic of the low power signal ULPZ and an activation signal STTOZ and outputs an operation result as an activation control signal OINZ. While the low power signal ULPZ is at a high level, the activation control signals DPNZ, PONZ, and OINZ are held at a low level and activation control signals DPPX, POPX, and OIPX are held at a high level. Accordingly, for example, switches SW1, SW2, and SW3 illustrated in FIG. 6 are turned off during the low power consumption mode PD.

Since the activation signal STTPZ is held at a high level during the low power consumption mode PD, an internal voltage enable signal VINENZ is also held at a high level. The regulator VINRGL illustrated in FIG. 6 receives the internal voltage enable signal VINENZ at a high level and is turned off. During the low power consumption mode PD, boost voltage lines VPP and VOO and an internal power supply line VIN are disconnected from a power supply line VDD.

The voltage detection circuit VPPDET2 holds a boost enable signal VPPENZ at a low level while the low power signal ULPZ is at a high level. The voltage detection circuit VOODET2 holds a boost enable signal VOOENZ at a low level while the low power signal ULPZ is at a high level. For this reason, pumping circuits VPPPMP and VOOPMP illustrated in FIG. 6 do not generate boost voltages VPP and VOO during the low power consumption mode PD.

The voltage generation circuit VPPGGEN2 couples a boost voltage line VPPG to the power supply line VDD while the low power signal ULPZ is at a high level. The operation of the internal power supply control section 22A may be substantially identical or similar to the operation of the internal power supply control section 22 illustrated in FIG. 3 in the normal operation mode, for example, when the low power signal ULPZ is at a low level.

Figure 13:
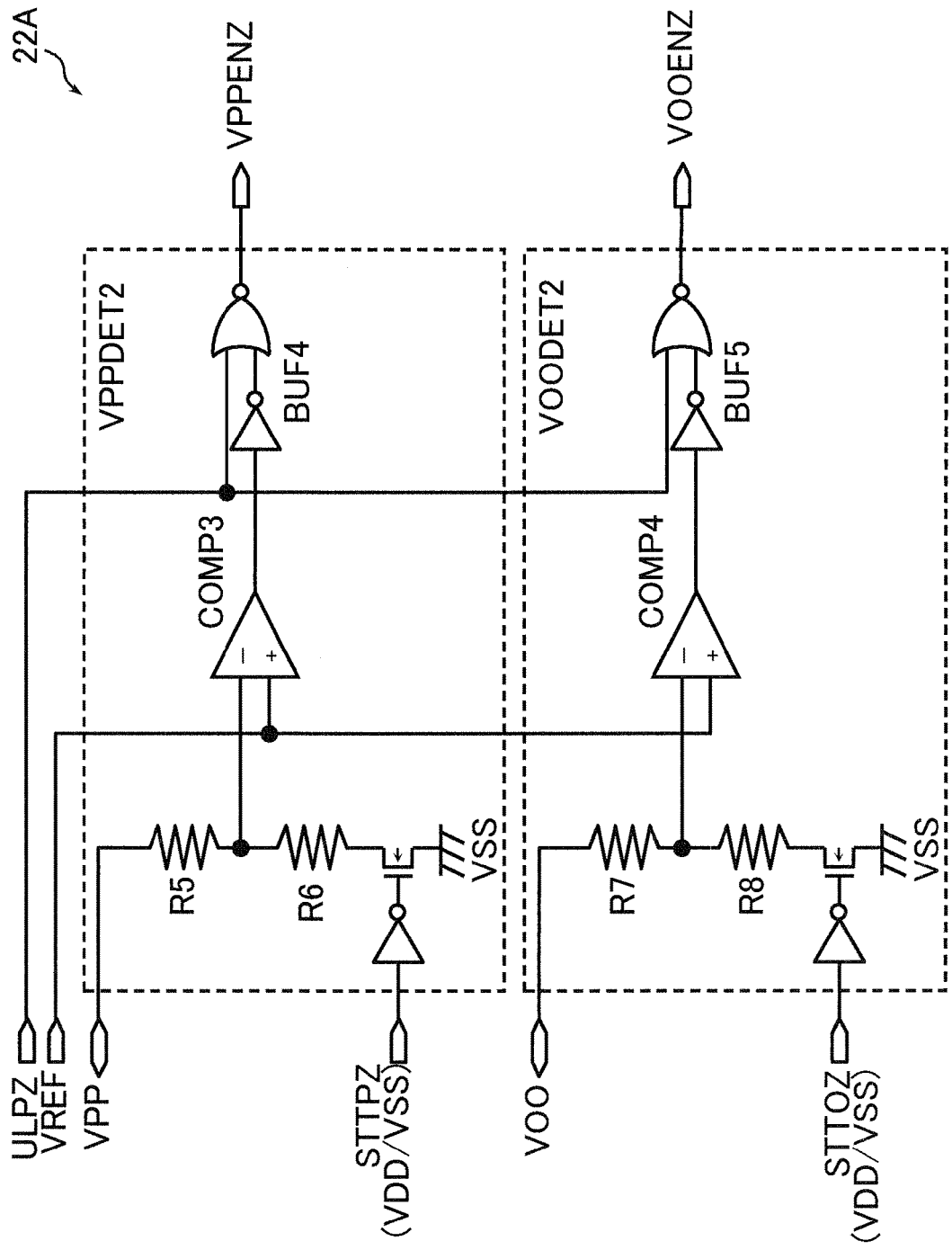
FIG. 13 illustrates an exemplary power supply detection circuits.

FIG. 13 illustrates exemplary power supply detection circuits. The power supply detection circuits illustrated in FIG. 13 may be the voltage detection circuits VPPDET2 and VOODET2 illustrated in FIG. 12. In the voltage detection circuit VPPDET2, one input of a NOR gate of a buffer BUF4 is coupled not to a ground line VSS but to a low power signal line ULPZ. In the voltage detection circuit VOODET2, one input of a NOR gate of a buffer BUF5 is coupled not to the ground line VSS but to the low power signal line ULPZ. For this reason, the boost enable signals VPPENZ and VOOENZ are set at a low level while the low power signal ULPZ is at a high level. The configuration of the rest of the voltage detection circuits VPPDET2 and VOODET2 may be substantially identical or similar to that of a corresponding part of the voltage detection circuits VPPDET1 and VOODET1 illustrated in FIG. 4.

Figure 14:
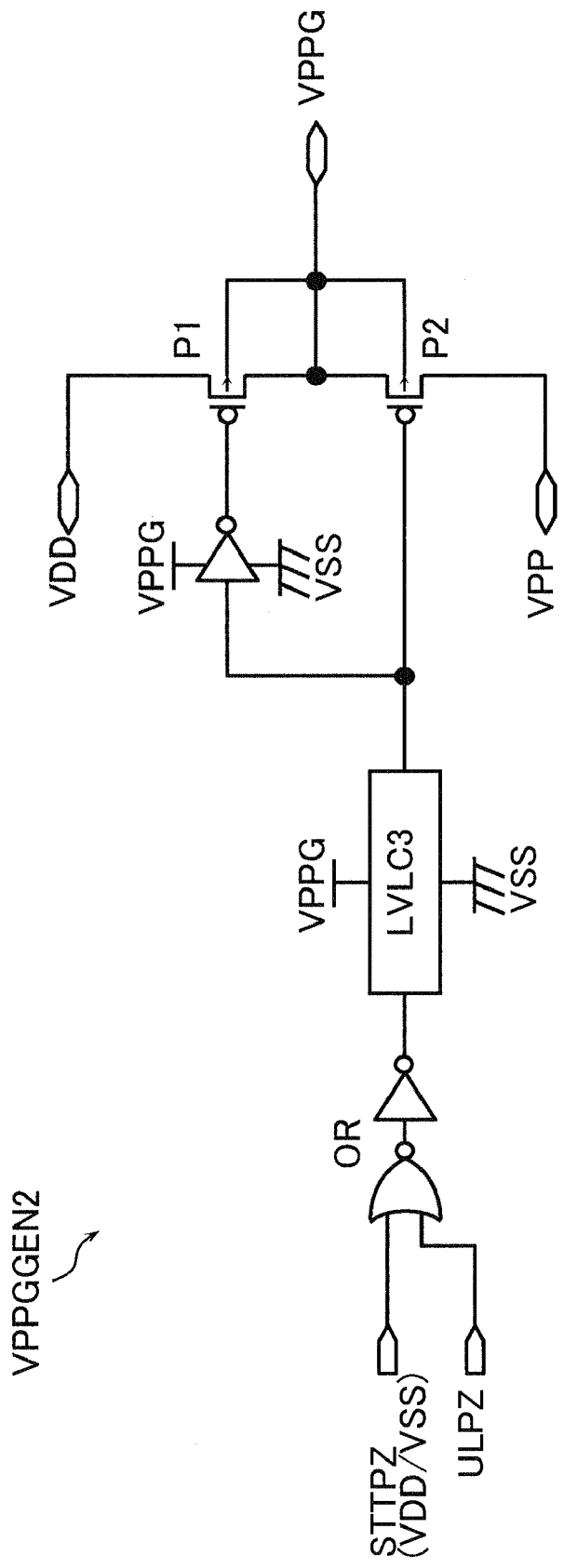
FIG. 14 illustrates an exemplary voltage generation circuit.

FIG. 14 illustrates an exemplary voltage generation circuit. The voltage generation circuit illustrated in FIG. 14 may be the voltage generation circuit VPPGGEN2 illustrated in FIG. 12. A level converter LVLC3 of the voltage generation circuit VPPGGEN2 receives the activation signal STTPZ or the low power signal ULPZ through an OR circuit. For this reason, while the low power signal ULPZ is at a high level, a transistor P1 is turned on, and a transistor P2 is turned off. The boost voltage line VPPG is coupled to the power supply line VDD.

The configuration of the rest of the voltage generation circuit VPPGGEN2 may be substantially identical or similar to that of a corresponding part of the voltage generation circuit VPPGGEN1 illustrated in FIG. 5.

Figure 15:
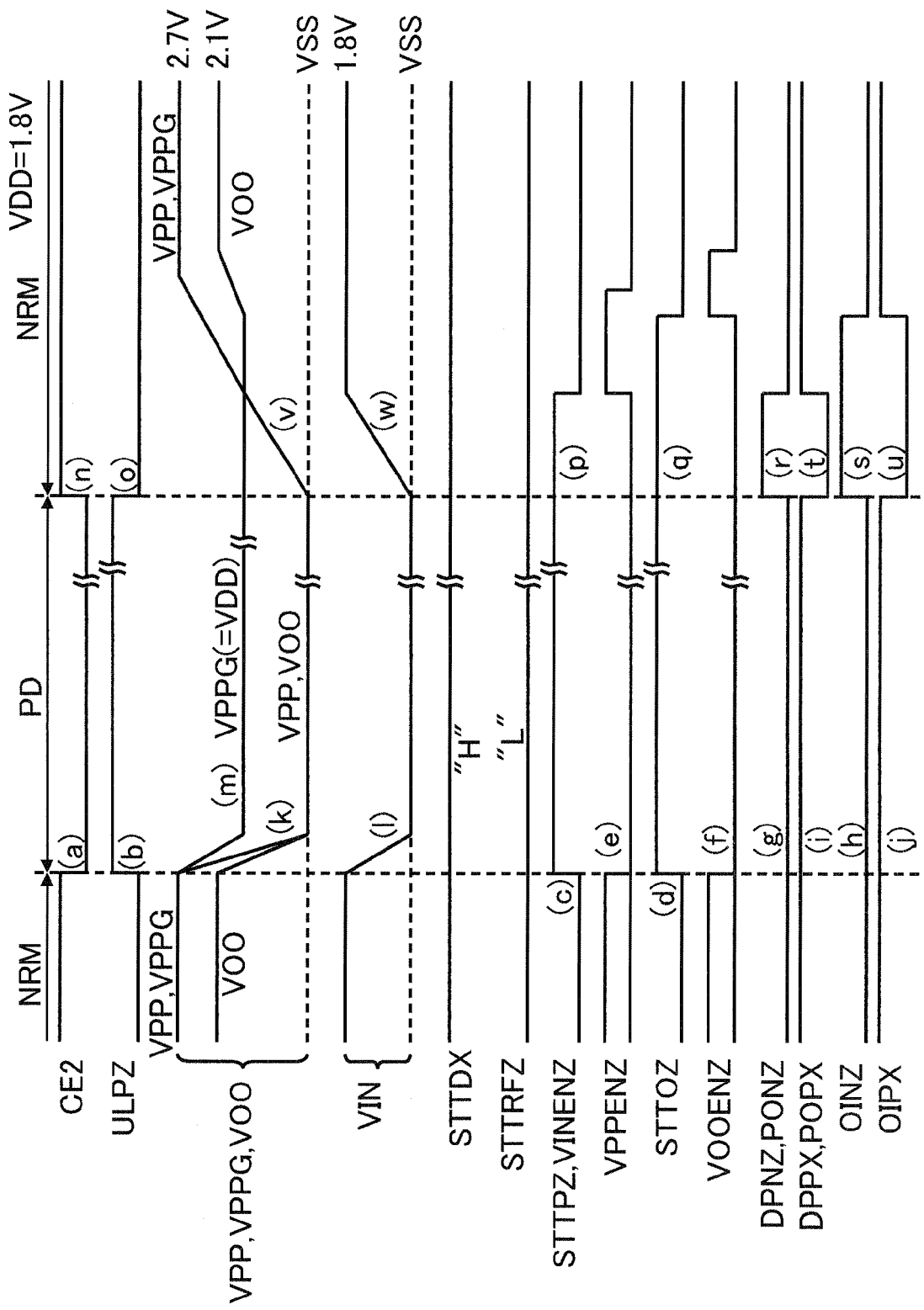
FIG. 15 illustrates an exemplary operation of a semiconductor memory in low power consumption mode.

FIG. 15 illustrates an exemplary operation of a semiconductor memory in the low power consumption mode. The semiconductor memory illustrated in FIG. 15 may be the semiconductor memory MEM illustrated in FIG. 10. The operation at the time of power-on may be substantially identical or similar to the operation illustrated in FIG. 9. A description of an operation identical to an operation illustrated in FIG. 9 will be omitted or reduced.

A CPU or a memory controller MCNT illustrated in FIG. 8 changes the chip enable signal CE2 from a high level to a low level ((a) in FIG. 15) when the semiconductor memory MEM is shifted from the normal operation mode NRM to the low power consumption mode PD. The change of the chip enable signal CE2 to a low level causes the low power signal ULPZ to change to a high level ((b) in FIG. 15). The system SYS continues supplying a power supply voltage VDD, for example, 1.8 V to the semiconductor memory MEM during the low power consumption mode PD. A power supply detection circuit VDDDET illustrated in FIG. 11 holds an activation signal STTDX at a high level. A reference voltage generation circuit REFGEN illustrated in FIG. 11 receives the activation signal STTDX at a high level and continues outputting a reference voltage VREF.

The low power signal ULPZ at a high level causes the activation signals STTPZ and STTOZ to change to a high level ((c) and (d) in FIG. 15). The waveform of the internal voltage enable signal VINENZ may be substantially identical or similar to that of the activation signal STTPZ.

The low power signal ULPZ at a high level sets the boost enable signals VPPENZ and VOOENZ to a low level ((e) and (f) in FIG. 15). For this reason, the pumping circuits VPPPMP and VOOPMP illustrated in FIG. 6 stop generating the boost voltages VPP and VOO. With the low power signal ULPZ at a high level, the activation control signals DPNZ, PONZ, and OINZ are held a at low level ((g) and (h) in FIG. 15), and the activation control signals DPPX, POPX, and OIPX are held at a high level ((i) and (j) in FIG. 15). Since the switches SW1 to SW3 remain off, the boost voltages VPP and VOO and an internal power supply voltage VIN drop gradually to a ground voltage VSS ((k) and (l) in FIG. 15).

The voltage generation circuit VPPGGEN2 illustrated in FIG. 14 couples the boost voltage line VPPG to the power supply line VDD while the low power signal ULPZ is at a high level. A boost voltage VPPG is held at the power supply voltage VDD during the low power consumption mode PD ((m) in FIG. 15). For this reason, level converters LVLC1 and LVLC2 illustrated in FIG. 12 and inverters coupled to the outputs of the level converters LVLC1 and LVLC2 operate normally during the low power consumption mode PD. Since the activation control signals DPPX, POPX, and OIPX at a high level (VPPG) are securely output from the inverters, the switches SW1 to SW3 illustrated in FIG. 6 are securely turned off.

A pMOS transistor P4 of the switch SW1 illustrated in FIG. 6 receives the power supply voltage VDD at a source and the boost voltage VPPG (=VDD) at a substrate during the low power consumption mode PD. Since the boost voltage VPPG is set to the power supply voltage VDD, a forward voltage is not applied to a pn junction of the pMOS transistor P4 of the switch SW1, and a substrate current does not flow.

Substrates of the pMOS transistors P1 and P2 illustrated in FIG. 14 are coupled to the boost voltage line VPPG. Since the boost voltage VPPG is set to the power supply voltage VDD during the low power consumption mode PD, a forward voltage is not applied to a pn junction of the pMOS transistor P1 having a source to which the power supply voltage VDD is supplied, and a substrate current does not flow. An increase in standby current is prevented. If the substrate of the transistor P1 is coupled to the boost voltage line VPP, a forward voltage may be applied to the pn junction of the transistor P1 during the low power consumption mode PD, and a substrate current may flow.

The CPU or memory controller MCNT changes the chip enable signal CE2 from a low level to a high level ((n) in FIG. 15) when the semiconductor memory MEM is shifted from the low power consumption mode PD to the normal operation mode NRM. The change of the chip enable signal CE2 to a high level causes the low power signal ULPZ to change to a low level ((o) in FIG. 15).

When the operation mode returns to the normal operation mode NRM, the boost voltages VPP and VOO become substantially identical to the ground voltage VSS. Comparators COMP1 and COMP2 of the activation signal generation circuits STTPGEN2 and STTOGEN2 illustrated in FIG. 11 output a high level signal. For this reason, the activation signals STTPZ and STTOZ are kept a at high level ((p) and (q) in FIG. 15). The activation signals STTPZ and STTOZ at a high level, and the low power signal ULPZ at a low level, cause the activation control signals DPNZ, PONZ, and OINZ to change to a high level ((r) and (s) in FIG. 15) and the activation control signals DPPX, POPX, and OIPX to change to a low level ((t) and (u) in FIG. 15). The switches SW1 to SW3 illustrated in FIG. 6 are turned on, and the boost voltage lines VPP and VOO and the internal power supply line VIN rise to the power supply voltage VDD ((v) and (w) in FIG. 15). The operation after this may be substantially identical or similar to the operation after (k) in FIG. 9.

The second embodiment achieves substantially the same advantages as those in the first embodiment. The boost voltage VPPG being supplied to substrates of the pMOS transistors of the voltage generation circuit VPPGGEN2 and switches SW1 to SW3 prevents a circuit malfunction during the low power consumption mode PD. A substrate current does not flow to a pn junction of each pMOS transistor of the voltage generation circuit VPPGGEN2 and the switches SW1 to SW3, and latch-up is prevented. Since the power supply voltage VDD is supplied to the semiconductor memory MEM during the low power consumption mode PD, measures against latch-up may be important.

Figure 16:
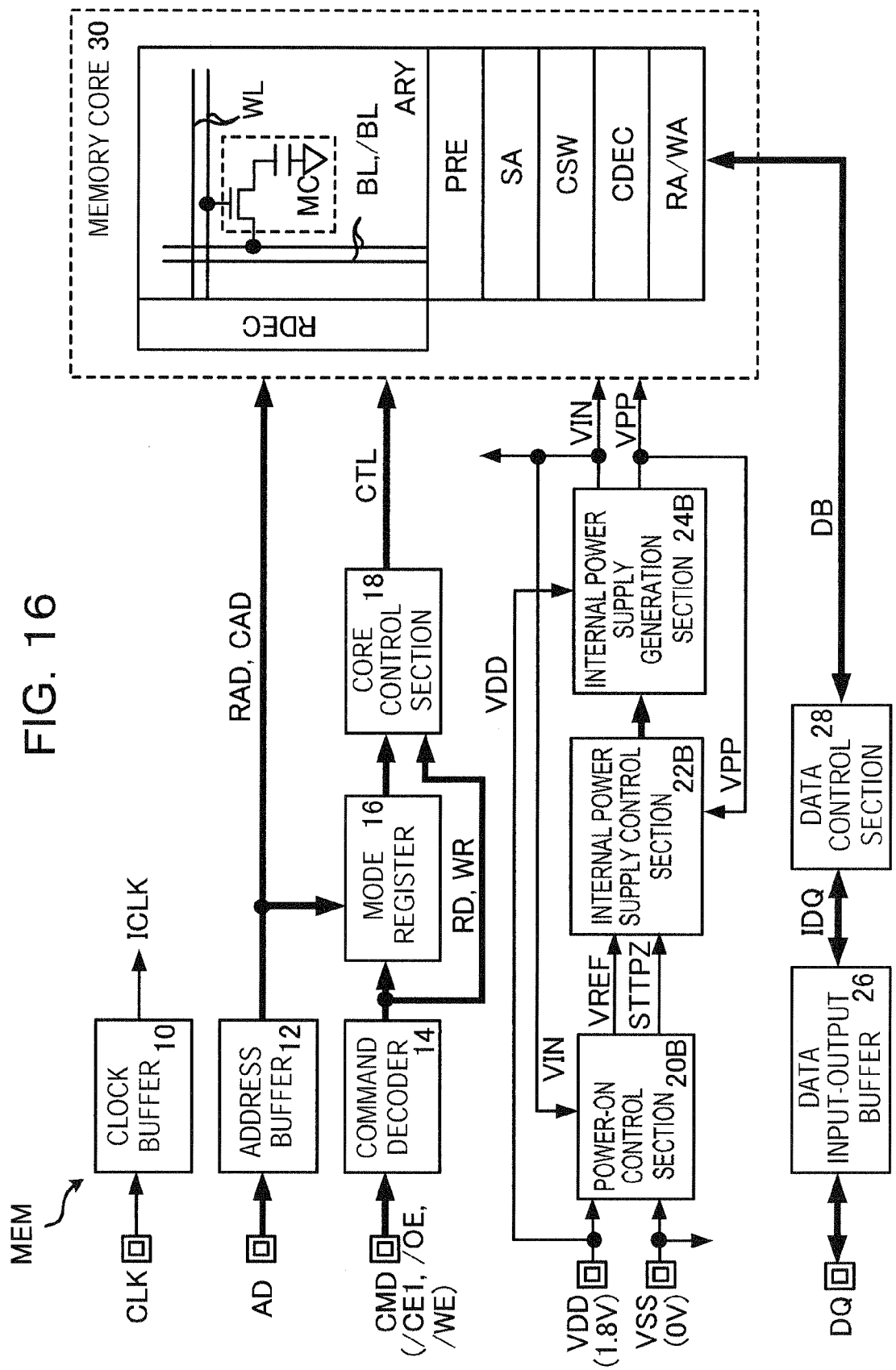
FIG. 16 illustrates a third embodiment.

FIG. 16 illustrates a third embodiment. The same elements as those in the previous embodiments are denoted by the same reference numerals, and a description thereof will be omitted or reduced. For example, a semiconductor device may be a semiconductor memory MEM such as a pseudo SRAM. The semiconductor memory MEM includes a power-on control section 20B, an internal power supply control section 22B, and an internal power supply generation section 24B. The power-on control section 20B, internal power supply control section 22B, and internal power supply generation section 24B may correspond to the power-on control section 20, internal power supply control section 22, and internal power supply generation section 24 in FIG. 1. The semiconductor memory MEM may not generate a boost voltage VOO. The configuration of the rest of the semiconductor memory MEM is substantially identical or similar to that of a corresponding part illustrated in FIG. 1. The semiconductor memory MEM may operate in synchronism with a clock signal CLK or may operate asynchronously with the clock signal CLK. The semiconductor memory MEM may include a memory macro (IP) mounted in a system LSI or the like and may include a semiconductor storage device enclosed in a package. For example, the semiconductor memory MEM may be mounted in a system SYS illustrated in FIG. 8.

Figure 17:
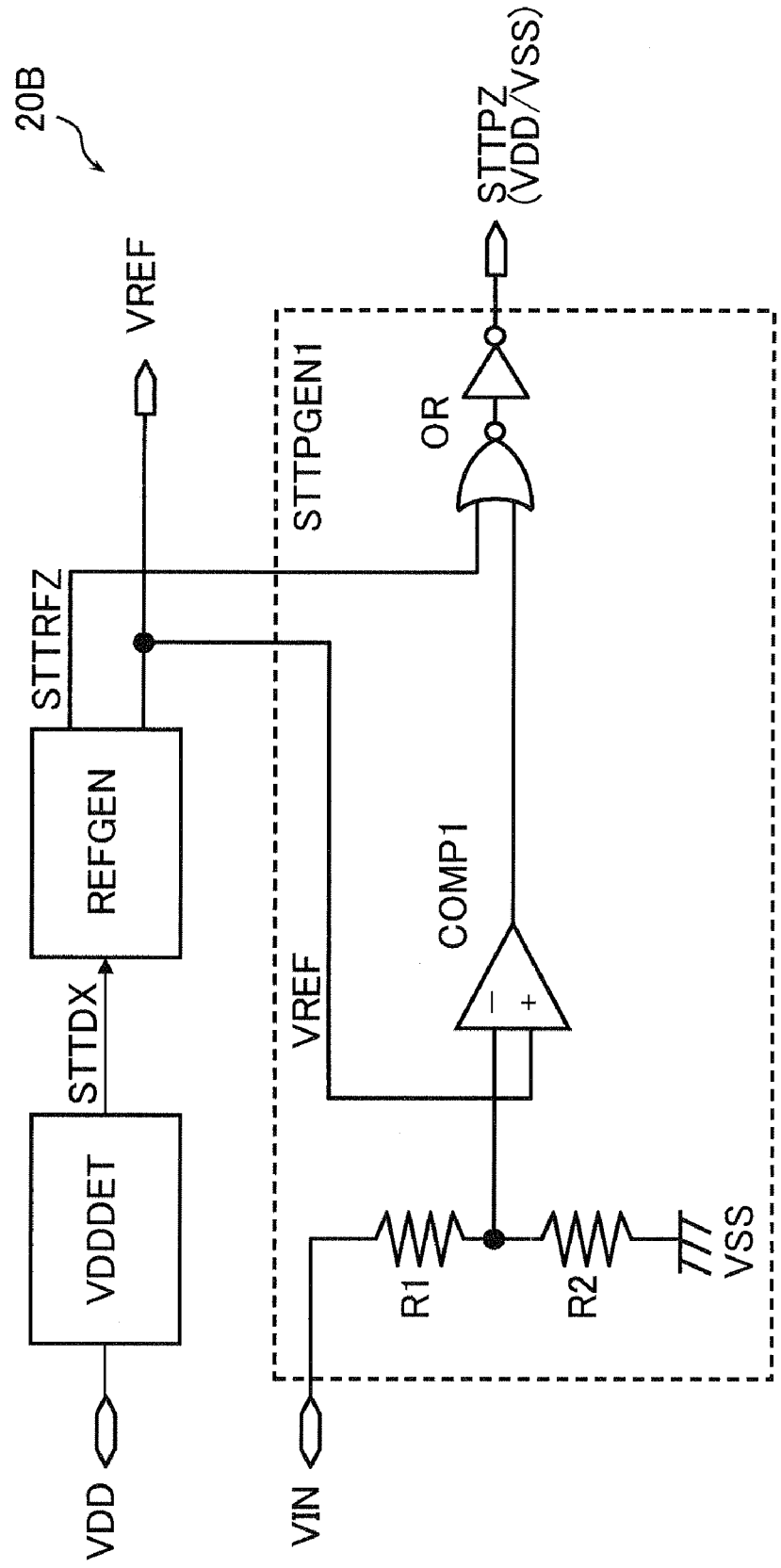
FIG. 17 illustrates an exemplary power-on control section.

FIG. 17 illustrates an exemplary power-on control section. The power-on control section illustrated in FIG. 17 may be the power-on control section 20B illustrated in FIG. 16. The power-on control section 20B may not include the activation signal generation circuit STTOGEN1 illustrated in FIG. 2. The configuration of the rest of the power-on control section 20B may be substantially identical or similar to that of a corresponding part of the power-on control section 20 illustrated in FIG. 2.

Figure 18:
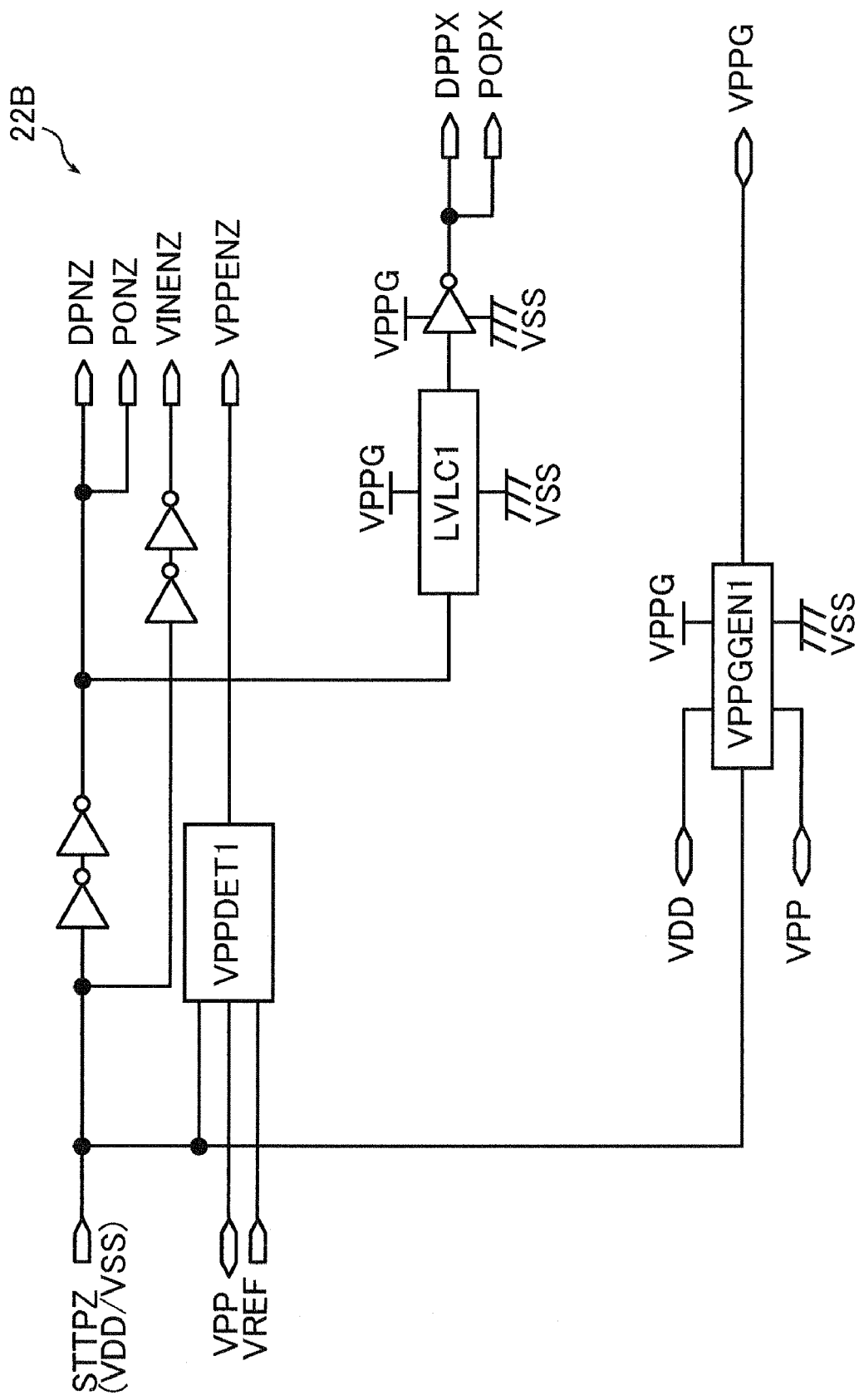
FIG. 18 illustrates an exemplary internal power supply control section.

FIG. 18 illustrates an exemplary internal power supply control section. The internal power supply control section illustrated in FIG. 18 may be the internal power supply control section 22B illustrated in FIG. 16. The internal power supply control section 22B may not include the voltage detection circuit VOODET1, buffer BUF3, and level converter LVLC2 illustrated in FIG. 3. For this reason, the internal power supply control section 22B may not generate activation control signals OINZ and OIPX and a boost enable signal VOOENZ. The configuration of the rest of the internal power supply control section 22B may be substantially identical or similar to that of a corresponding part of the internal power supply control section 22 illustrated in FIG. 3.

Figure 19:
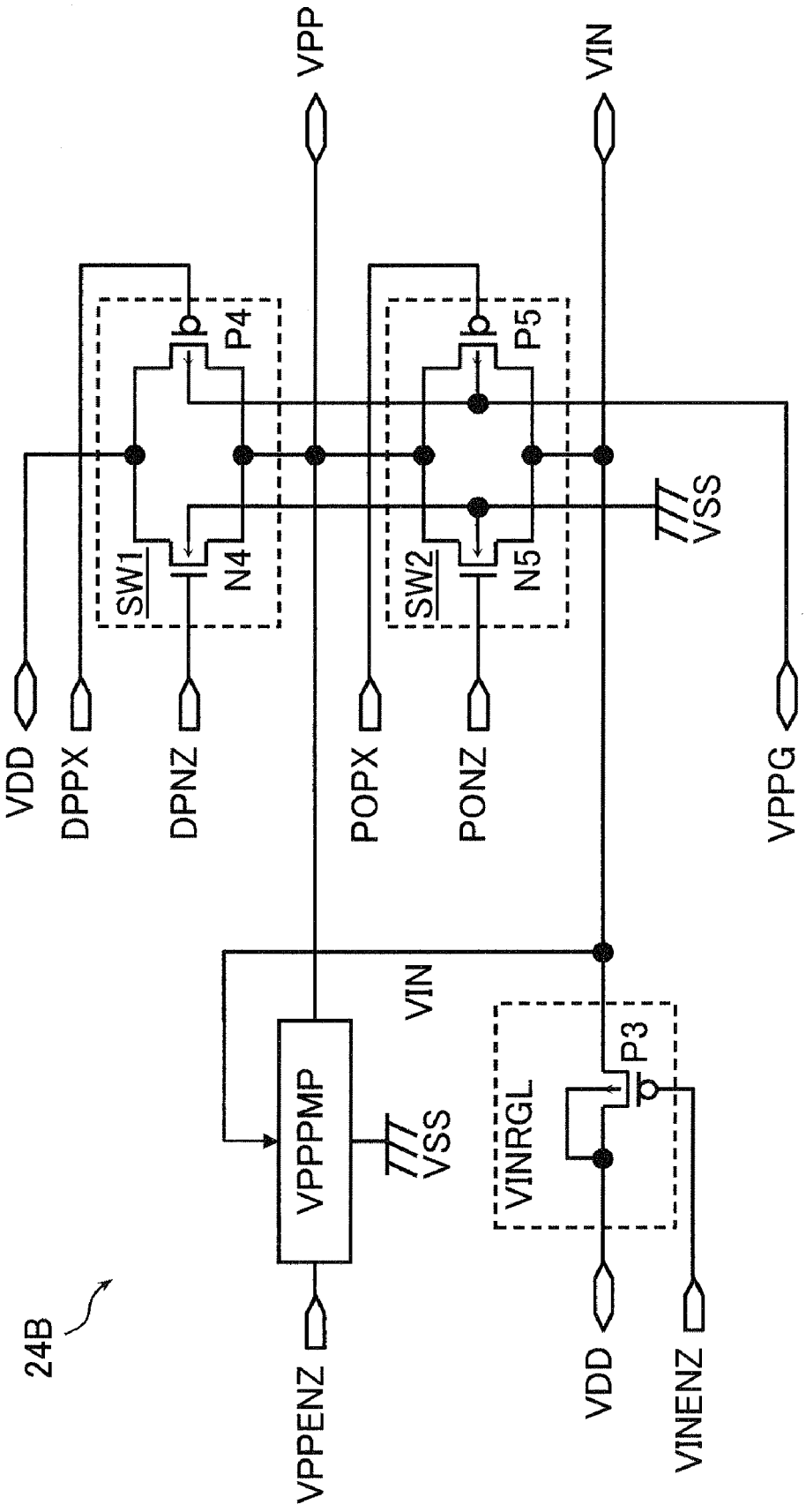
FIG. 19 illustrates an exemplary internal power supply generation section.

FIG. 19 illustrates an exemplary internal power supply generation section. The internal power supply generation section illustrated in FIG. 19 may be the internal power supply generation section 24B illustrated in FIG. 16. The internal power supply generation section 24B does not include the pumping circuit VOOPMP and switch SW3 illustrated in FIG. 6. An internal power supply line VIN is coupled to a switch SW2. The configuration of the rest of the internal power supply generation section 24B may be substantially identical or similar to that of a corresponding part of the internal power supply generation section 24 illustrated in FIG. 6.

In the third embodiment, the operation of the semiconductor memory MEM in power-on is indicated by, for example, eliminating the waveforms of the boost voltage VOO, activation signal STTOZ, activation control signal OINZ, and boost enable signal VOOENZ from the waveforms illustrated in FIG. 9.

The third embodiment achieves the same advantages as those of the previous embodiments. Even in the semiconductor memory MEM, which does not generate the boost voltage VOO, an internal circuit including a pMOS transistor is prevented from malfunctioning when power is turned on, and the semiconductor memory MEM is also prevented from malfunctioning.

Figure 20:
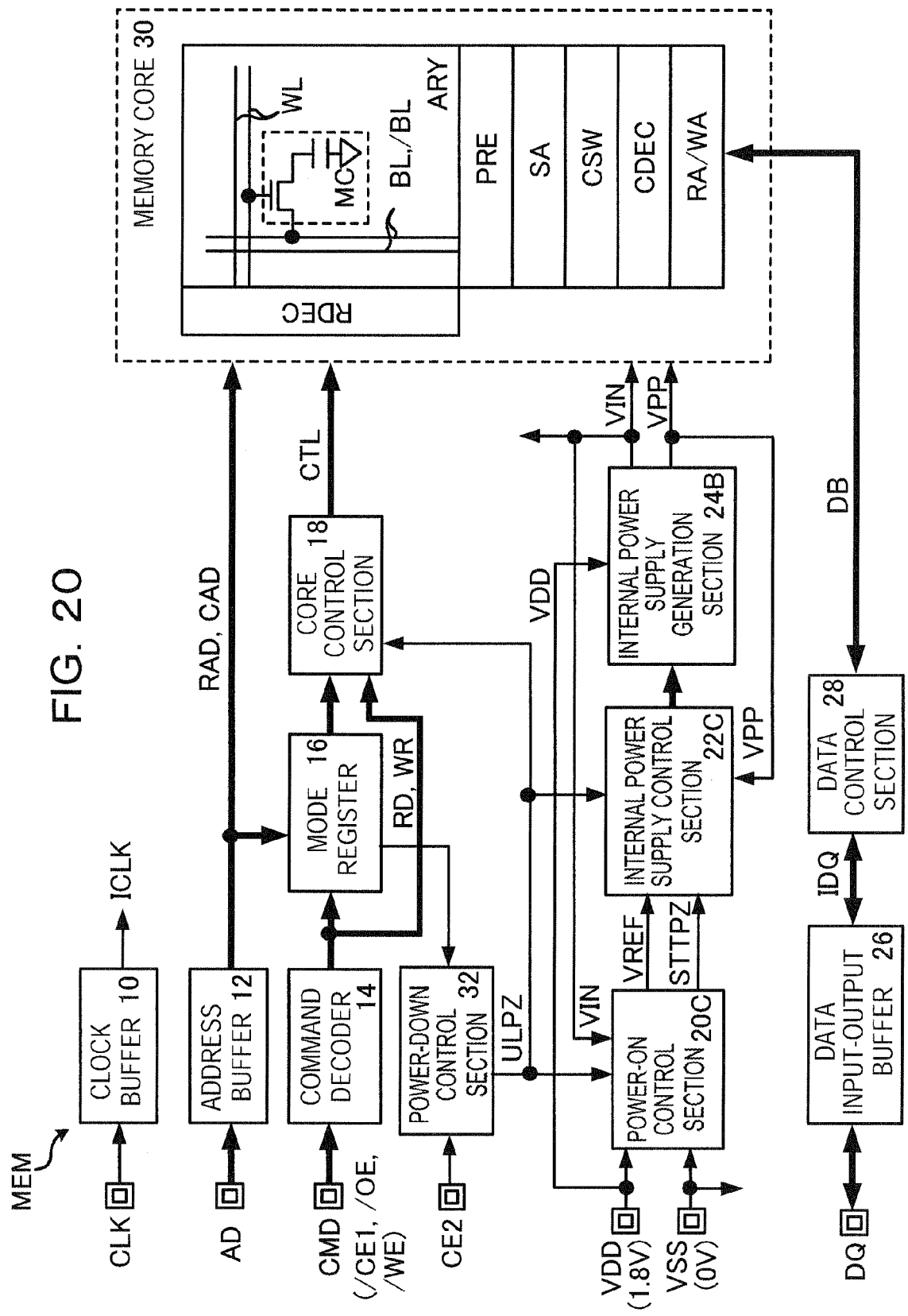
FIG. 20 illustrates a fourth embodiment.

FIG. 20 illustrates a fourth embodiment. The same elements in the fourth embodiment as those in the previous embodiments are denoted by the same reference numerals, and a description thereof will be omitted or reduced. For example, a semiconductor device may be a semiconductor memory MEM such as a pseudo SRAM. The semiconductor memory MEM includes a power-on control section 20C, an internal power supply control section 22C, and an internal power supply generation section 24B. The power-on control section 20C, internal power supply control section 22C, and internal power supply generation section 24B may correspond to the power-on control section 20A, internal power supply control section 22A, and internal power supply generation section 24 illustrated in FIG. 10. The internal power supply generation section 24B may be the internal power supply generation section 24B illustrated in FIG. 16. The semiconductor memory MEM may not generate a boost voltage VOO. The configuration of the rest of the semiconductor memory MEM is substantially identical to that of a corresponding part illustrated in FIG. 10.

The semiconductor memory MEM may operate in synchronism with a clock signal CLK or may operate asynchronously with the clock signal CLK. The semiconductor memory MEM may include a memory macro (IP) mounted in a system LSI or the like and may include a semiconductor storage device enclosed in a package. For example, the semiconductor memory MEM may be mounted in a system SYS illustrated in FIG. 8.

Figure 21:
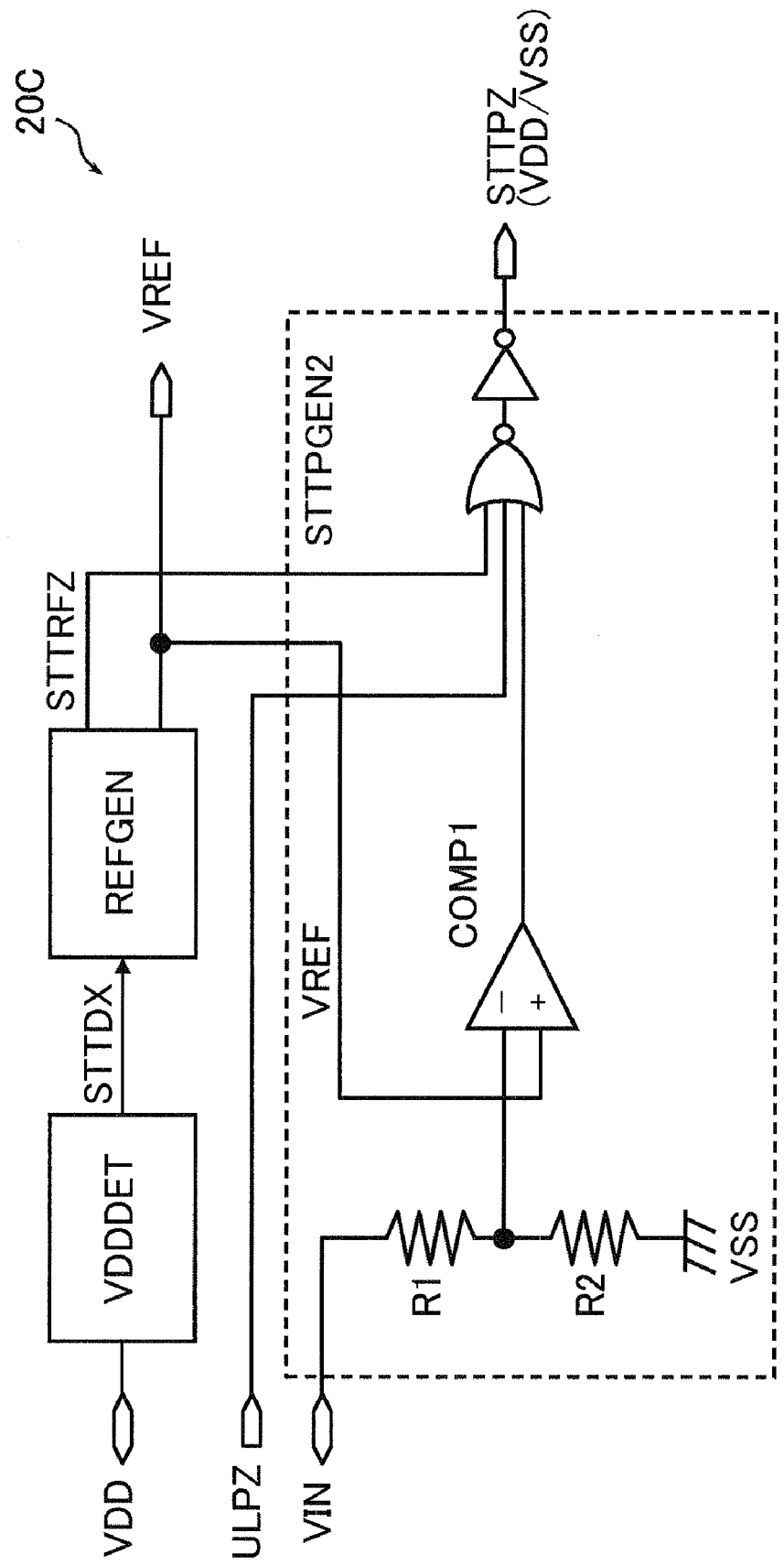
FIG. 21 illustrates an exemplary power-on control section.

FIG. 21 illustrates an exemplary power-on control section. The power-on control section illustrated in FIG. 21 may be the power-on control section 20C illustrated in FIG. 20. The power-on control section 20C may not include the activation signal generation circuit STTOGEN2 illustrated in FIG. 11. The configuration of the rest of the power-on control section 20C may be substantially identical or similar to that of a corresponding part of the power-on control section 20A illustrated in FIG. 11.

Figure 22:
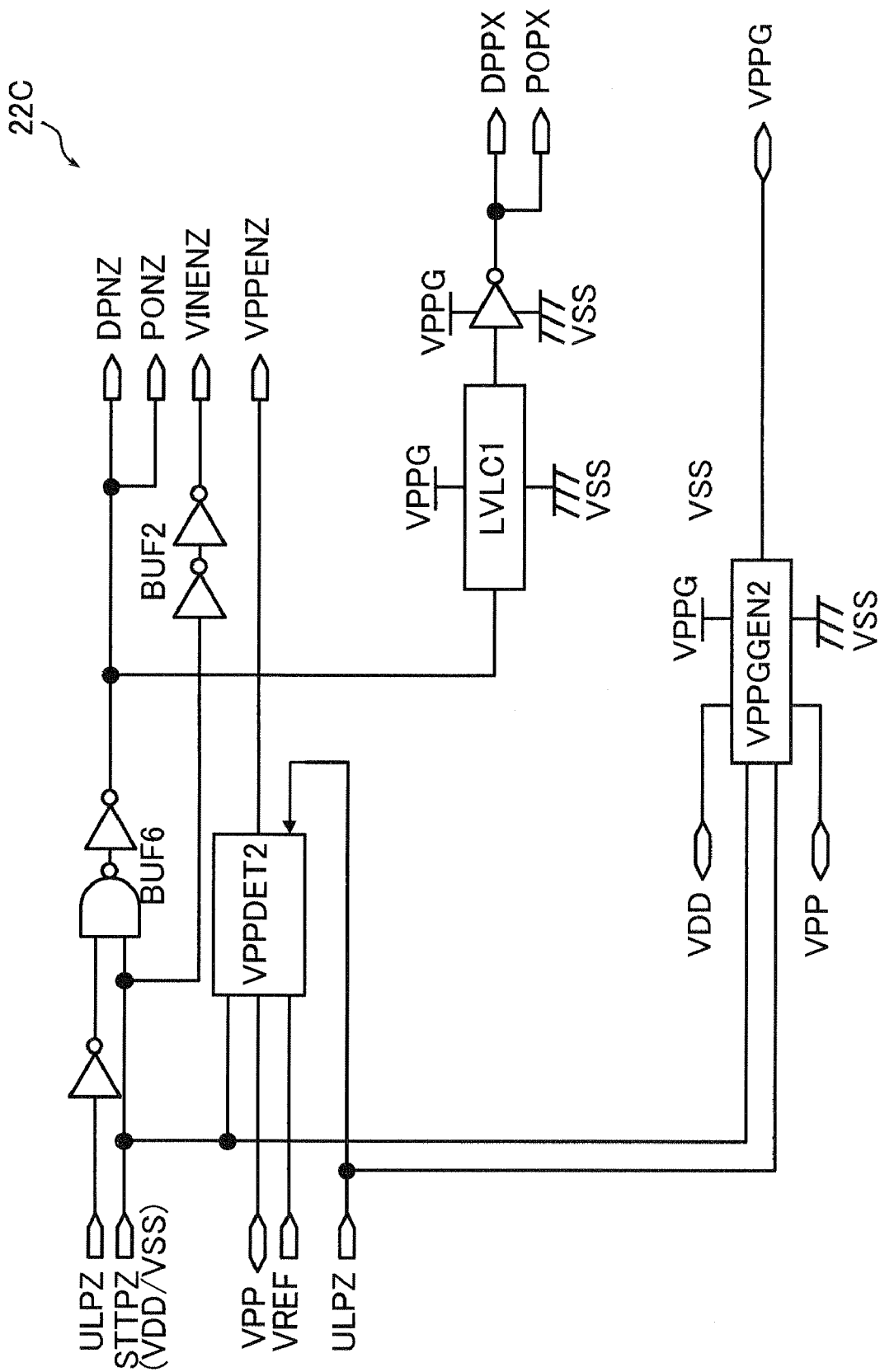
FIG. 22 illustrates an exemplary internal power supply control section.

FIG. 22 illustrates an exemplary internal power supply control section. The internal power supply control section illustrated in FIG. 22 may be the internal power supply control section 22C illustrated in FIG. 20. The internal power supply control section 22C may not include the voltage detection circuit VOODET2, buffer BUF7, and level converter LVLC2 illustrated in FIG. 12. For this reason, the internal power supply control section 22C may not generate the activation control signals OINZ and OIPX and the boost enable signal VOOENZ illustrated in FIG. 12. The configuration of the rest of the internal power supply control section 22C may be substantially identical or similar to that of a corresponding part of the internal power supply control section 22A illustrated in FIG. 12.

In the fourth embodiment, the operation of the semiconductor memory MEM in power-on is indicated by, for example, eliminating the waveforms of the boost voltage VOO, activation signal STTOZ, activation control signal OINZ, and boost enable signal VOOENZ from the waveforms illustrated in FIG. 9. The operation of the semiconductor memory MEM in a low power consumption mode PD is indicated by, for example, eliminating the waveforms of the boost voltage VOO, activation signal STTOZ, and boost enable signal VOOENZ from the waveforms illustrated in FIG. 15. The fourth embodiment achieves substantially the same advantages as those of the previous embodiments.

Figure 23:
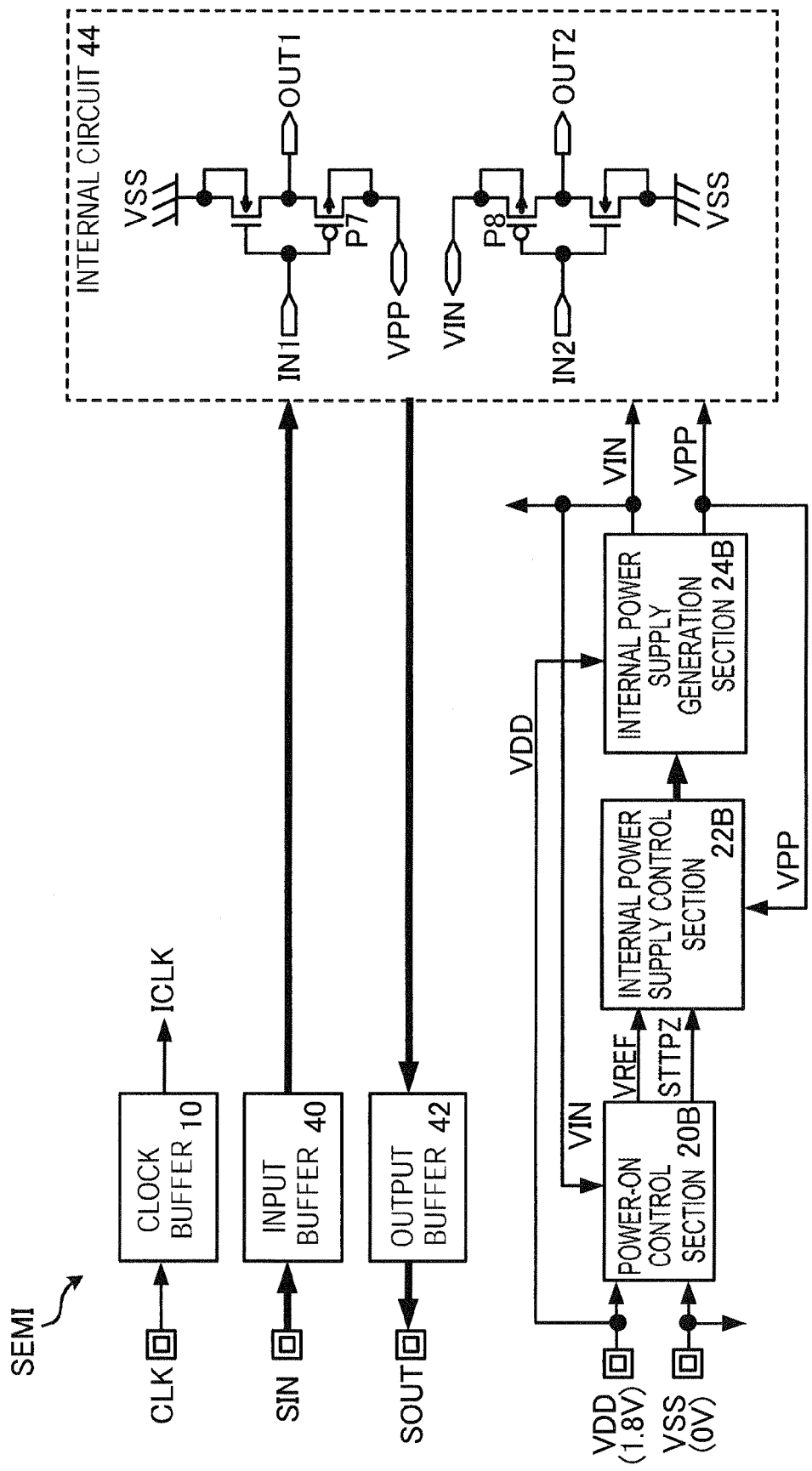
FIG. 23 illustrates a fifth embodiment.

FIG. 23 illustrates a fifth embodiment. The same elements in the fifth embodiment as those in the previous embodiments are denoted by the same reference numerals, and a description thereof will be omitted or reduced. For example, a semiconductor device SEMI may be the CPU, memory controller MCNT or FONT, or flash memory FLASH illustrated in FIG. 9. The semiconductor device SEMI may include a clock buffer 10 as illustrated in FIG. 16, a power-on control section 20B, an internal power supply control section 22B, an internal power supply generation section 24B, an input buffer 40, an output buffer 42, and an internal circuit 44.

The semiconductor device SEMI may operate in synchronism with a clock signal CLK or may operate asynchronously with the clock signal CLK. The semiconductor memory SEMI may include a memory macro (IP) mounted in a system LSI or the like and may include a semiconductor storage device enclosed in a package.

The input buffer 40 receives an input signal SIN through an external terminal and outputs the received signal to the internal circuit 44. The output buffer 42 outputs, as an output signal SOUT, a signal output from the internal circuit to an external terminal. The power-on control section 20B, internal power supply control section 22B, and internal power supply generation section 24B may be the power-on control section 20B, internal power supply control section 22B, and internal power supply generation section 24B illustrated in FIGS. 17, 18, and 19.

The layout of the internal circuit 44 may be substantially identical or similar to the layout illustrated in FIG. 7. The operation of the semiconductor memory SEMI in power-on is indicated by, for example, eliminating the waveform of a signal associated with the boost voltage VOO from the waveforms illustrated in FIG. 9.

If the semiconductor device SEMI uses a boost voltage VOO, the semiconductor device SEMI may include the power-on control section 20, internal power supply control section 22, and internal power supply generation section 24 illustrated in FIG. 1. If the semiconductor device SEMI includes a low power consumption mode PD, the semiconductor device SEMI may include a power-on control section 20C and an internal power supply control section 22C illustrated in FIG. 20. If the semiconductor device SEMI uses the boost voltage VOO and includes the low power consumption mode PD, the semiconductor device SEMI may include the power-on control section 20A, internal power supply control section 22A, and internal power supply generation section 24 illustrated in FIG. 10. The fifth embodiment achieves substantially the same advantages as those in the previous embodiments.

Although the semiconductor memory MEM such as a pseudo SRAM is used in the previous embodiments, for example, a DRAM or non-volatile memory may be used.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor device comprising:
   a first boost circuit configured to generate a first boost voltage by boosting an external voltage and supplies the first boost voltage to an internal circuit;
   a first circuit configured to supply the external voltage to an output of the first boost circuit when power is turned on and to supply the first boost voltage to the output of the first boost circuit when the external voltage reaches a given voltage; and
   a substrate potential generation circuit configured to supply a substrate potential to the first circuit, wherein the substrate potential generation circuit includes:
      a first level converter configured to convert a level of an activation control signal generated when detecting that the external voltage reaches the given voltage; and
      a selection circuit configured to select one of the external voltage and the first boost voltage based on an output from the first level converter.

2. The semiconductor device according to claim 1, wherein the first circuit includes a CMOS transfer gate.

3. The semiconductor device according to claim 1, wherein the first circuit is controlled in accordance with the activation control signal.

4. The semiconductor device according to claim 1, wherein the substrate potential, which follows the external voltage in power-on, is supplied to the first circuit.

5. The semiconductor device according to claim 2, wherein the CMOS transfer gate includes a pMOS transfer gate.

6. The semiconductor device according to claim 1, wherein the selection circuit selects the external voltage when the internal circuit is in a low power consumption mode.

7. The semiconductor device according to claim 1, further comprising,
   a first control circuit configured to control the first circuit, wherein the first control circuit includes:
      a second level converter configured to convert a level of the activation control signal; and
      a logic circuit configured to perform a logical operation on an output of the second level converter.

8. The semiconductor device according to claim 1, further comprising:
- a second boost circuit configured to generate a second boost voltage lower than the first boost voltage and supplies the second boost voltage to the internal circuit; and
- a second circuit configured to supply the external voltage to an output of the second boost circuit when power is turned on and to supply the second boost voltage to the output of the second boost circuit when the external voltage reaches the given voltage.

9. The semiconductor device according to claim 8, wherein
the first circuit is coupled to an external voltage line to which the external voltage is supplied, and
the second circuit is coupled to the external voltage line through the first circuit.

10. The semiconductor device according to claim 8, wherein
the second circuit includes a CMOS transfer gate.

11. The semiconductor device according to claim 5, further comprising:
- an nMOS transfer gate;
- a first control circuit configured to generate a first control signal for controlling the pMOS transistor in accordance with the activation control signal generated when detecting that the external voltage reaches the given voltage; and
- a second control circuit which configured to generate a second control signal for controlling the nMOS transistor in accordance with the activation control signal.

12. A semiconductor device comprising:
an internal circuit configured to receive a first boost voltage obtained by boosting an external voltage, and
a substrate potential generation circuit configured to supply a substrate potential to the first circuit;
wherein the external voltage is supplied to a first power supply line of the first boost voltage when power is turned on, and the first boost voltage is supplied to the first power supply line when the external voltage reaches a given voltage; and
wherein the substrate potential generation circuit includes:
a first level converter configured to convert a level of an activation control signal generated when detecting that the external voltage reaches the given voltage; and
a selection circuit configured to select one of the external voltage and the boost voltage based on an output from the level converter.

13. The semiconductor device according to claim 12, wherein
the first boost voltage is supplied to the first power supply line in accordance with an activation control signal generated when detecting that the external voltage reaches the given voltage.

14. The semiconductor device according to claim 13, wherein
the substrate potential, which follows the external voltage in power-on, is supplied to a substrate.

15. A system comprising:
a controller; and
a semiconductor device which is controlled in accordance with a control signal from the controller,
wherein the semiconductor device includes:
an internal circuit configured to receive a first boost voltage obtained by boosting an external voltage, and
a substrate potential generation circuit configured to supply a substrate potential to the first circuit,
wherein the external voltage is supplied to a first power supply line of the first boost voltage when power is turned on, and the first boost voltage is supplied to the first power supply line when the external voltage reaches a given voltage, and
wherein the substrate potential generation circuit includes:
a first level converter configured to convert a level of an activation control signal generated when detecting that the external voltage reaches the given voltage; and
a selection circuit configured to select on of the external voltage and the boost voltage based on an output from the level converter.

16. The system according to claim 15, wherein the first boost voltage is supplied to the first power supply line in accordance with the activation control signal.

17. The system according to claim 15, wherein
the substrate potential, which follows the external voltage in power-on, is supplied to a substrate of the semiconductor device.

18. The system according to claim 15, wherein
the controller supplies a control signal for setting a low power consumption mode to the semiconductor device, and
wherein the external voltage is supplied to a substrate of the semiconductor device based on the control signal when the internal circuit is in the low power consumption mode.

* * * * *